United States Patent
Hong et al.

(10) Patent No.: US 12,190,964 B2
(45) Date of Patent: Jan. 7, 2025

(54) NONVOLATILE MEMORY DEVICE PREVENTING OVERSHOOT OF INTERNAL VOLTAGE AND METHOD OF OPERATING NONVOLATILE MEMORY DEVICE

(71) Applicant: Samsung Electronics Co., Ltd., Suwon-si (KR)

(72) Inventors: Sanggi Hong, Anyang-si (KR); Chaehoon Kim, Gwacheon-si (KR); Sangwon Park, Seoul (KR); Jiho Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 243 days.

(21) Appl. No.: 17/750,315

(22) Filed: May 21, 2022

(65) Prior Publication Data
US 2023/0143210 A1    May 11, 2023

(30) Foreign Application Priority Data
Nov. 8, 2021  (KR) .......... 10-2021-0152118

(51) Int. Cl.
*G11C 16/26*  (2006.01)
*G11C 16/04*  (2006.01)
(Continued)

(52) U.S. Cl.
CPC .......... *G11C 16/26* (2013.01); *G11C 16/0483* (2013.01); *G11C 16/08* (2013.01); *G11C 16/24* (2013.01)

(58) Field of Classification Search
None
See application file for complete search history.

(56) References Cited

U.S. PATENT DOCUMENTS 9,183,939 B2  11/2015  Nam et al.
9,275,749 B1  3/2016  Ogawa
(Continued)

FOREIGN PATENT DOCUMENTS

KR  20160137803 A  12/2016
KR  20200097009 A  8/2020
WO  2018144111 A1  8/2018

OTHER PUBLICATIONS

Extended European Search Report dated Dec. 21, 2022 for corresponding European Patent Application No. EP 22184302.2.

*Primary Examiner* — Alfredo Bermudez Lozada
(74) *Attorney, Agent, or Firm* — Muir Patent Law, PLLC

(57) ABSTRACT

In a method of operating a nonvolatile memory device that includes a memory block including cell strings where each of the cell strings includes a string selection transistor, memory cells and a ground selection transistor which are connected in series and disposed in a vertical direction, each of word-lines coupled to the memory cells is set up to a respective target level during a word-line set-up period, a sensing operation on target memory cells is performed by applying a read voltage to a selected word-line coupled to the target memory cells while applying a read pass voltage to unselected word-lines during a sensing period, and while consuming an internal voltage connected to the unselected word-lines in a particular circuit in the nonvolatile memory device, a voltage level of the unselected word-lines is recovered to a level of the internal voltage during a discharge period of a word-line recovery period.

20 Claims, 27 Drawing Sheets

(51) Int. Cl.
*G11C 16/08* (2006.01)
*G11C 16/24* (2006.01)

(56) References Cited

U.S. PATENT DOCUMENTS

| | | |
|---|---|---|
| 9,830,994 B1* | 11/2017 | Mitsuhira .......... G11C 16/3427 |
| 10,192,624 B2 | 1/2019 | Song et al. |
| 2008/0157730 A1 | 7/2008 | Kim et al. |
| 2011/0148509 A1 | 6/2011 | Pan |
| 2015/0003169 A1* | 1/2015 | Nam .................... G11C 11/5628 |
| | | 365/185.25 |
| 2016/0260489 A1* | 9/2016 | Lee .................... G11C 16/3427 |

* cited by examiner

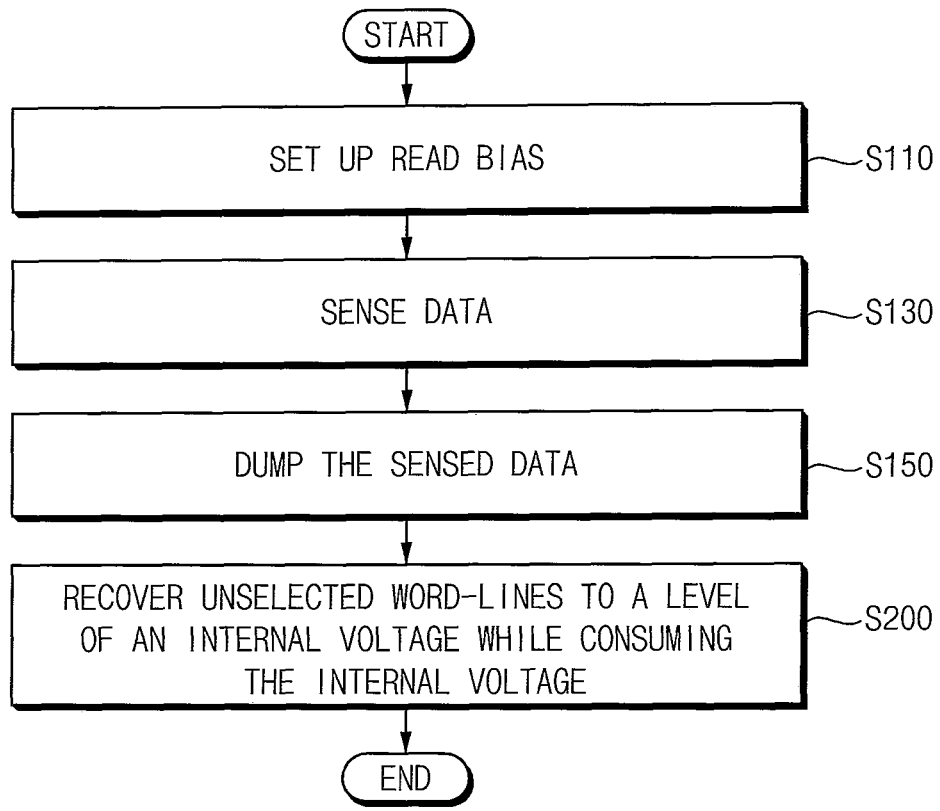

OPERATE AT LEAST ONE OF A PLURALITY OF VOLTAGE
GENERATORS IN A VOLTAGE GENERATION CIRCUIT ─── S230

OPERATE AN OSCILLATOR IN A VOLTAGE GENERATION
CIRCUIT ─── S250

NONVOLATILE MEMORY DEVICE PREVENTING OVERSHOOT OF INTERNAL VOLTAGE AND METHOD OF OPERATING NONVOLATILE MEMORY DEVICE

CROSS-REFERENCE TO RELATED APPLICATION(S)

This US application claims priority under 35 USC § 119 to Korean Patent Application No. 10-2021-0152118, filed on Nov. 8, 2021, in the Korean Intellectual Property Office (KIPO), the disclosure of which is incorporated in its entirety by reference herein.

BACKGROUND

1. Technical Field

Example embodiments generally relate to memory devices, and more particularly to nonvolatile memory devices and methods of operating nonvolatile memory devices.

2. Discussion of the Related Art

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and lose the stored data when power is off. Nonvolatile memory devices, such as flash memory devices, may maintain stored data even though power is off. Volatile memory devices are widely used as main memories of various apparatuses, while nonvolatile memory devices are widely used for storing program codes and/or data in various electronic devices, such as computers, mobile devices, etc.

Recently, nonvolatile memory devices of three-dimensional structure such as a vertical NAND memory devices have been developed to increase integration degree and memory capacity of the nonvolatile memory devices. An overshoot of an internal voltage may occur in recovering word-lines during a read operation on the nonvolatile memory devices thus the overshoot may be desired to be prevented or reduced.

SUMMARY

Some example embodiments may provide a method of operating a nonvolatile memory device, capable of preventing overshoot in recovering word-lines.

Some example embodiments may provide a nonvolatile memory device capable of preventing overshoot in recovering word-lines.

According to example embodiments, in a method of operating a nonvolatile memory device that includes at least one memory block including a plurality of cell strings where each of the plurality of cell strings includes a string selection transistor, a plurality of memory cells and a ground selection transistor which are connected in series and disposed in a vertical direction between a bit-line and a common source line, each of a plurality of word-lines coupled to the plurality of memory cells is set up to a respective target level during a word-line set-up period, a sensing operation on target memory cells is performed by applying a read voltage to a selected word-line coupled to the target memory cells, among the plurality of word-lines while applying a read pass voltage to unselected word-lines among the plurality of word-lines during a sensing period, a word-line recovery operation is performed by recovering a voltage level of the read pass voltage applied to the unselected word-lines to a level of an internal voltage during a word-line recovery period, and the internal voltage connected to the unselected word-lines is consumed by activating a particular circuit of the nonvolatile memory device. The particular circuit is connected to the internal voltage and is not associated with the word-line recovery operation.

According to example embodiments, a nonvolatile memory device includes a memory cell array and a control circuit. The memory cell array includes at least one memory block including a plurality of cell strings where each of the plurality of cell strings includes a string selection transistor, a plurality of memory cells and a ground selection transistor which are connected in series and disposed in a vertical direction between a bit-line and a common source line. The control circuit sets up each of a plurality of word-lines coupled to the plurality of memory cells to a respective target level during a word-line set-up period, performs a sensing operation on target memory cells by applying a read voltage to a selected word-line coupled to the target memory cells, among the plurality of word-lines while applying a read pass voltage to unselected word-lines among the plurality of word-lines during a sensing period, and performs a word-line recovery operation by recovering a voltage level of the unselected word-lines to a level of an internal voltage during a word-line recovery period, and consumes the internal voltage connected to the unselected word-lines to which the read pass voltage is applied, in a particular circuit of the nonvolatile memory device during a discharge period within the recovery period. The particular circuit connected to the internal voltage is configured to activate during the discharge period, and the particular circuit is not associated with the word-line recovery operation.

According to example embodiments, a nonvolatile memory device includes a memory cell array and a control circuit. The memory cell array includes at least one memory block including a plurality of cell strings where each of the plurality of cell strings includes a string selection transistor, a plurality of memory cells and a ground selection transistor which are connected in series and disposed in a vertical direction between a bit-line and a common source line. The control circuit sets up each of a plurality of word-lines coupled to the plurality of memory cells to a respective target level during a word-line set-up period, performs a sensing operation on target memory cells by applying a read voltage to a selected word-line coupled to the target memory cells, among the plurality of word-lines while applying a read pass voltage to unselected word-lines among the plurality of word-lines during a sensing period, and performs a word-line recovery operation by recovering a voltage level of the unselected word-lines, to which the read pass voltage is applied, to a level of an external voltage applied from an external device and to a level of an internal voltage smaller than the level of the external voltage sequentially during a word-line recovery period.

Therefore, in the nonvolatile memory device and a method of operating the nonvolatile memory device, during a word-line recovery operation in the read operation, a voltage of the unselected word-lines connected to the internal voltage is consumed internally in a particular circuit not associated with the recovery operation while recovering the voltage level of the unselected word-lines to a level of the internal voltage, and thus, an overshoot of the internal voltage IVC may be prevented or reduced, which may occur in the word-line recovery operation.

BRIEF DESCRIPTION OF THE DRAWINGS

Illustrative, non-limiting example embodiments will be more clearly understood from the following detailed description in conjunction with the accompanying drawings.

FIG. 1 is a flow chart illustrating a method of operating a nonvolatile memory device according to example embodiments.

FIG. 2 illustrates an example operation of consuming an internal voltage internally in the nonvolatile memory device in the method of FIG. 1 according to example embodiments.

FIG. 3 illustrates an example operation of consuming an internal voltage internally in the nonvolatile memory device in the method of FIG. 1 according to example embodiments.

FIG. 4 illustrates an example operation of consuming an internal voltage internally in the nonvolatile memory device in the method of FIG. 1 according to example embodiments.

DETAILED DESCRIPTION OF THE EMBODIMENTS

Figure 5:
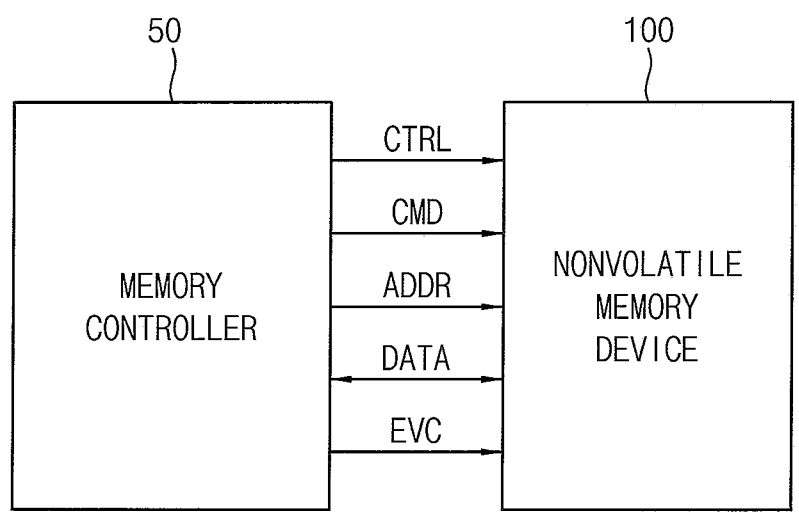
FIG. 5 is a block diagram illustrating a memory system (i.e., a storage device) according to example embodiments.

Various example embodiments will be described more fully hereinafter with reference to the accompanying drawings, in which some example embodiments are shown.

FIG. 1 is a flow chart illustrating a method of operating a nonvolatile memory device according to example embodiments.

FIG. 1 illustrates a method of operating a nonvolatile memory device including at least one memory block which includes a plurality of cell strings, where each cell string includes a string selection transistor, a plurality of memory cells and a ground selection transistor connected between a bit-line and a common source line as will be described with reference to FIGS. 6 and 11 through 23. Herein, for convenience of description, the terms of a cell string, a memory cell string, and a NAND string may be used interchangeably.

Referring to FIG. 1, according to the method, each of a plurality of word-lines coupled to the plurality of memory cells is set up to a respective target level during a word-line set-up period (operation S110). A voltage generation circuit in the nonvolatile memory device sets up a read voltage applied to a selected word-line and read pass voltage (or pass voltage) applied to unselected word-lines to a respective target level during a word-line set-up period. Herein, for convenience of description, the terms of a read pass voltage and a pass voltage may be used interchangeably.

A sensing operation is performed on target memory cells by applying the read voltage to the selected word-line coupled to the target memory cells, among the plurality of word-lines while applying the read pass voltage to the unselected word-lines among the plurality of word-lines during a sensing period (operation S130).

Sensed data latched in a page buffer circuit is dumped to a data input/output (I/O) circuit connected to the page buffer circuit during a data dump period (operation S150).

A voltage level of the unselected word-lines is recovered to a level of an internal voltage connected to the unselected word-lines to which the read pass voltage is applied while consuming the internal voltage in the nonvolatile memory device during a discharge period within a word-line recovery period (operation S200). Herein, the discharge period and the recovery period will be described with reference to FIG. 25.

For recovering the voltage level of the unselected word-lines to a level of the internal voltage during the word-line recovery period, the internal voltage is connected to the unselected word-lines. Because the voltage level of the unselected word-lines has a level of the read pass voltage greater than the level of the internal voltage, an overshoot may occur in the unselected word-lines during the word-line recovery period. In a nonvolatile memory device including a plurality of mats, internal voltages associated with two mats may be provided to transistors included in a peripheral circuit without regard to operation of the mats for increasing degree of freedom of design. Therefore, a logic including transistors using internal voltages belonging to different mats including a first mat and a second mat in case of plane independent read may be existed. A timing error may occur in the logic during operation of the first mat because the logic includes transistors using an internal voltage associated with the second mat.

However, according to a method of operating a nonvolatile memory device, occurrence of overshoot may be prevented or reduced because the voltage level of the unselected word-lines is recovered to the level of the internal voltage by consuming the internal voltage connected to the unselected word-lines to which the read pass voltage is applied, internally in the nonvolatile memory device during the discharge period within the word-line recovery period. For example, several particular circuits of the nonvolatile memory device using the internal voltage may operate or activate during the discharge period such that an overshoot of the internal voltage may be prevented or reduced. The several particular circuits may not substantially operate for the word-line recovery operation. In other words, the several particular circuits may not be associated the word-line recovery operation.

FIG. 2 illustrates an example operation of consuming an internal voltage internally in the nonvolatile memory device in the method of FIG. 1 according to example embodiments.

Referring to FIG. 2, for consuming the internal voltage internally in the nonvolatile memory device (operation S200a), transistors using the internal voltage in each of at least a portion of a plurality of page buffers of a page buffer circuit are repeatedly turned on and turned off during the discharge period (operation S210) as will be described with reference to FIGS. 6, 11 through 14, 25 and 26. The page buffer circuit is coupled to the at least one memory block through a plurality of bit-lines, and may latch sensed data in the sensing operation.

FIG. 3 illustrates an example operation of consuming an internal voltage internally in the nonvolatile memory device in the method of FIG. 1 according to example embodiments.

Referring to FIG. 3, for consuming the internal voltage internally in the nonvolatile memory device (operation S200b), a corresponding clock signal is generated based on the internal voltage in an oscillator of a voltage generation circuit during the discharge period (operation S230) as will be described with reference to FIGS. 20, 22, 25 and 27. The voltage generation circuit may generate word-line voltages including the read voltage and the read pass voltage.

FIG. 4 illustrates an example operation of consuming an internal voltage internally in the nonvolatile memory device in the method of FIG. 1 according to example embodiments.

Referring to FIG. 4, for consuming the internal voltage internally in the nonvolatile memory device (operation S200c), a corresponding voltage is generated based on the internal voltage in at least one voltage generator of a voltage generation circuit during the discharge period (operation S250) as will be described with reference to FIGS. 6, 19 to 21, 25 and 28. The voltage generation circuit may generate word-line voltages including the read voltage and the read pass voltage.

FIG. 5 is a block diagram illustrating a memory system (i.e., a storage device) according to example embodiments.

Referring to FIG. 5, a storage device (i.e., a memory system) 10 may include a memory controller 50 and at least one nonvolatile memory device 100.

In example embodiments, each of the memory controller 50 and the nonvolatile memory device 100 may be provided with the form of a chip, a package, or a module. Alternatively, the memory controller 50 and the nonvolatile memory device 100 may be packaged into one of various packages.

The nonvolatile memory device 100 may perform an erase operation, a program operation or a write operation under control of the memory controller 50. The nonvolatile memory device 100 receives a command CMD, an address ADDR and data DATA through input/output lines from the memory controller 50 for performing such operations. In addition, the nonvolatile memory device 100 receives a control signal CTRL through a control line from the memory controller 50. In addition, the nonvolatile memory device 100 receives an external voltage EVC through a power line from the memory controller 50.

Figure 6:
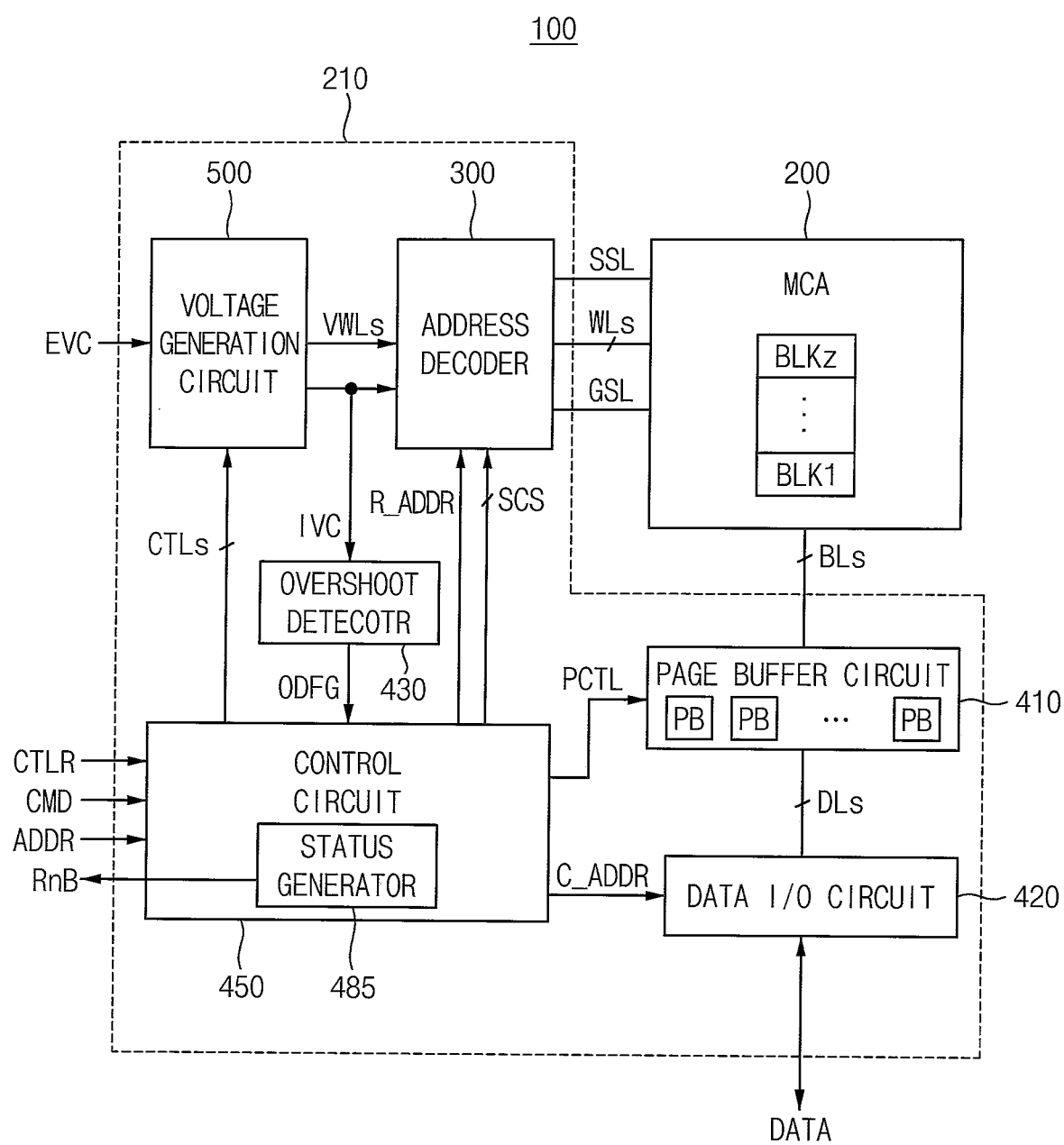
FIG. 6 is a block diagram illustrating the nonvolatile memory device in the memory system of FIG. 5 according to example embodiments.

FIG. 6 is a block diagram illustrating the nonvolatile memory device in the memory system of FIG. 5 according to example embodiments.

Referring to FIG. 6, the nonvolatile memory device 100 may include a memory cell array 200 and a peripheral circuit 210. The peripheral circuit 210 may include a page buffer circuit 410, a data input/output (I/O) circuit 420, a control circuit 450, a voltage generation circuit 500, an address decoder 300, an overshoot detector 430. Although not illustrated in FIG. 6, the peripheral circuit 210 may further include an I/O interface, a column logic, a pre-decoder, a temperature sensor, a command decoder, etc.

The memory cell array 200 may be coupled to the address decoder 300 through a string selection line SSL, a plurality of word-lines WLs, and a ground selection line GSL. In addition, the memory cell array 200 may be coupled to the page buffer circuit 410 through a plurality of bit-lines BLs. The memory cell array 200 may include a plurality of nonvolatile memory cells coupled to the plurality of word-lines WLs and the plurality of bit-lines BLs.

The memory cell array 200 may include a plurality of memory blocks BLK1 through BLKz, and each of the memory blocks BLK1 through BLKz may have a three-dimensional (3D) structure. Here, z is an integer greater than two. The memory cell array 200 may include a plurality of vertical cell strings and each of the vertical cell strings includes a plurality of memory cells stacked with respect to each other.

The control circuit 450 may, receive a command CMD, an address ADDR, and a control signal CTRL from the memory controller 50 and may control an erase loop, a program loop and a read operation of the nonvolatile memory device 100. The program loop may include a program operation and a program verification operation and the erase loop may include an erase operation and an erase verification operation.

In example embodiments, the control circuit 450 may generate control signals CTLs, which are used for controlling the voltage generation circuit 500, based on the command CMD, may generate a page buffer control signal PCTL for controlling the page buffer circuit 410, may generate switching control signals SCS for controlling the address decoder 300 and generate a row address R_ADDR and a column address C_ADDR based on the address ADDR. The control circuit 450 may provide the control signals CTLs to the voltage generation circuit 500 and may provide the page buffer control signal PCTL to the page buffer circuit 410.

In addition, the control circuit 450 may provide the row address R_ADDR and the switching control signals SCS to the address decoder 300 and provide the column address C_ADDR to the data I/O circuit 420. The control circuit 450 may include a status generator 485 and the status generator 485 may generate a status signal RnB indicating an operating status of the nonvolatile memory device 100. The status signal RnB may be referred to as a ready/busy signal because of the status signal RnB indicates either busy state or a ready state of the nonvolatile memory device 100.

The address decoder 300 may be coupled to the memory cell array 200 through the string selection line SSL, the plurality of word-lines WLs, and the ground selection line GSL. During program operation or read operation, the address decoder 300 may determine one of the plurality of word-lines WLs as a selected word-line based on the row address R_ADDR and may determine rest of the plurality of word-lines WLs except the selected word-line as unselected word-lines.

The voltage generation circuit 500 may generate word-line voltages VWLs associated with operations of the nonvolatile memory device 100 using and the external voltage EVC provided from the memory controller 50, based on control signals CTLs from the control circuit 450. Also, the voltage generation circuit 500 may generate the word-line voltages VWLs using an internal voltage generated internally. The word-line voltages VWLs may include a program voltage, a read voltage, a read pass voltage, or a verification voltage (an erase verification voltage and a program verification voltage). The word-line voltages VWLs may be applied to the plurality of word-lines WLs through the address decoder 300.

For example, during the erase operation, the voltage generation circuit 500 may apply erase voltage to a well of a selected memory block and may apply a ground voltage to all word-lines of the selected memory block. During the erase verification operation, the voltage generation circuit 500 may apply erase verification voltage to all word-lines of the selected memory block or may apply the erase verification voltage to the word-lines of the selected memory block by word-line basis.

For example, during the program operation, the voltage generation circuit 500 may apply a program voltage to the selected word-line and may apply a program pass voltage to the unselected word-lines. In addition, during the program verification operation, the voltage generation circuit 500 may apply a program verification voltage to the selected word-line and may apply a verification pass voltage to the unselected word-lines. In addition, during the read operation, the voltage generation circuit 500 may apply a read voltage to the selected word-line and may apply a read pass voltage to the unselected word-lines.

The page buffer circuit 410 may be coupled to the memory cell array 200 through the plurality of bit-lines BLs. The page buffer circuit 410 may include a plurality of page buffers PB. The page buffer circuit 410 may temporarily store data to be programmed in a selected page or data read out from the selected page of the memory cell array 200.

Figure 11:
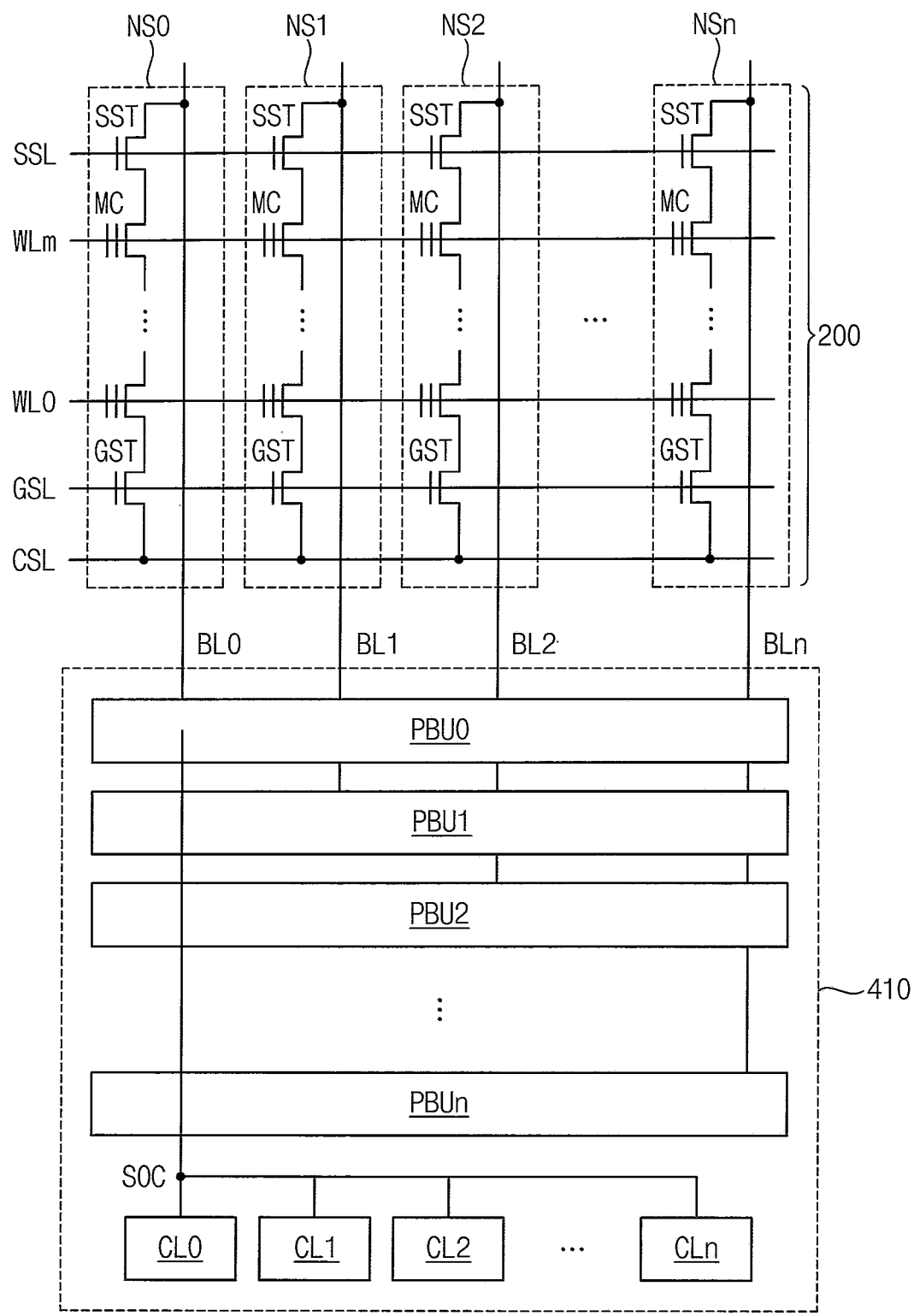
FIG. 11 is a schematic diagram of a connection of the memory cell array to the page buffer circuit in FIG. 6, according to example embodiments.

In example embodiments, page buffer units included in each of the plurality of page buffers PB (for example, first through (n+1)th page buffer units PBU0 through PBUn in FIG. 11) and cache latches included in each of the plurality of page buffers PB (for example, first through (n+1)th cache latches CL0 through CLn in FIG. 11) may be apart from each other, and have separate structures. Accordingly, the degree of freedom of wirings on the page buffer units may be improved, and the complexity of a layout may be reduced. In addition, because the cache latches are adjacent to data I/O lines, the distance between the cache latches and the data I/O lines may be reduced, and thus, data I/O speed may be improved.

The overshoot detector 430 may compare an internal voltage IVC connected to unselected word-lines with a reference voltage in recovering word-line during a read operation of the nonvolatile memory device 100, and may provide an overshoot detection flag ODFG to the control circuit 450 in response to an overshoot detecting based on a result of the comparison.

The data I/O circuit 420 may be coupled to the page buffer circuit 410 through a plurality of data lines DLs. During the program operation, the data I/O circuit 420 may receive program data DATA from the memory controller 50 and provide the program data DATA to the page buffer circuit 410 based on the column address C_ADDR received from the control circuit 450. During the read operation, the data I/O circuit 420 may provide read data DATA to the memory controller 50 based on the column address C_ADDR received from the control circuit 450.

Figure 7:
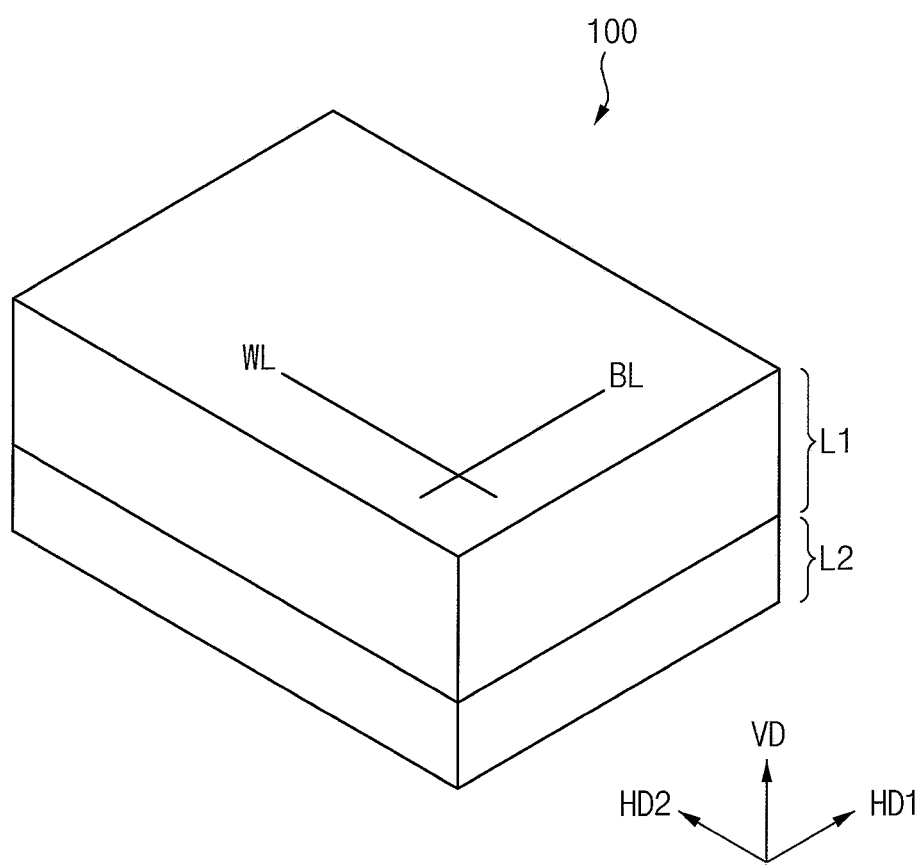
FIG. 7 schematically illustrates a structure of the nonvolatile memory device of FIG. 6 according to example embodiments.

FIG. 7 schematically illustrates a structure of the nonvolatile memory device of FIG. 6 according to example embodiments.

Referring to FIG. 7, the nonvolatile memory device 100 may include a first semiconductor layer L1 and a second semiconductor layer L2, and the first semiconductor layer L1 may be stacked in a vertical direction VD with respect to the second semiconductor layer L2. The second semiconductor layer L2 may be under the first semiconductor layer L1 in the vertical direction VD, and accordingly, the second semiconductor layer L2 may be close to a substrate.

In example embodiments, the memory cell array 200 in FIG. 6 may be formed (or, provided) in the first semiconductor layer L1, and the peripheral circuit 210 in FIG. 6 may be formed (or, provided) in the second semiconductor layer L2. Accordingly, the nonvolatile memory device 100 may have a structure in which the memory cell array 200 is on the peripheral circuit 210, that is, a cell over periphery (COP) structure. The COP structure may effectively reduce an area in a horizontal direction and improve the degree of integration of the memory device 10.

In example embodiments, the second semiconductor layer L2 may include the substrate, and by forming transistors on the substrate and metal patterns for wiring transistors, the peripheral circuit 210 may be formed in the second semiconductor layer L2. After the peripheral circuit 210 is formed in the second semiconductor layer L2, the first semiconductor layer L1 including the memory cell array 200 may be formed, and the metal patterns for connecting the word-lines WLs and the bit-lines BLs of the memory cell array 200 to the peripheral circuit 210 formed in the second semiconductor layer L2 may be formed. For example, each of the bit-lines BLs may extend in a first horizontal direction HD1, and each of the word-lines WLs may extend in a second horizontal direction HD2.

As the number of stages of memory cells in the memory cell array 200 increases with the development of semiconductor processes, that is, as the number of stacked word-lines WLs increases, an area of the memory cell array 200 may decrease, and accordingly, an area of the peripheral circuit 210 may also be reduced. According to an embodiment, to reduce an area of a region occupied by the page buffer circuit 410, the page buffer circuit 410 may have a structure in which the page buffer unit and the cache latch are separated from each other, and may connect sensing nodes included in each of the page buffer units commonly to a combined sensing node. This will be explained in detail with reference to FIG. 9.

Figure 8:
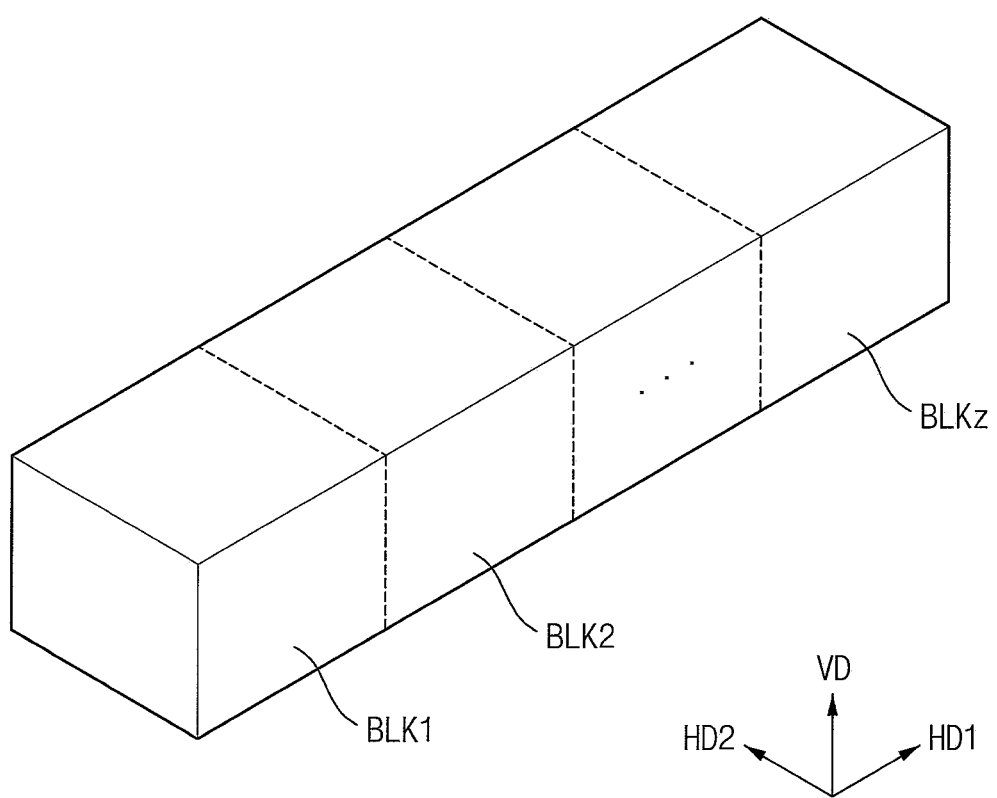
FIG. 8 is a block diagram illustrating an example of the memory cell array in FIG. 6 according to example embodiments.

FIG. 8 is a block diagram illustrating an example of the memory cell array in FIG. 6 according to example embodiments.

Referring to FIG. 8 the memory cell array 200 may include a plurality of memory blocks BLK1 to BLKz which extend along a plurality of directions HD1, HD2 and VD. In an embodiment, the memory blocks BLK1 to BLKz are selected by the address decoder 300 in FIG. 6. For example, the address decoder 300 may select a memory block BLK corresponding to a block address among the memory blocks BLK1 to BLKz.

Figure 9:
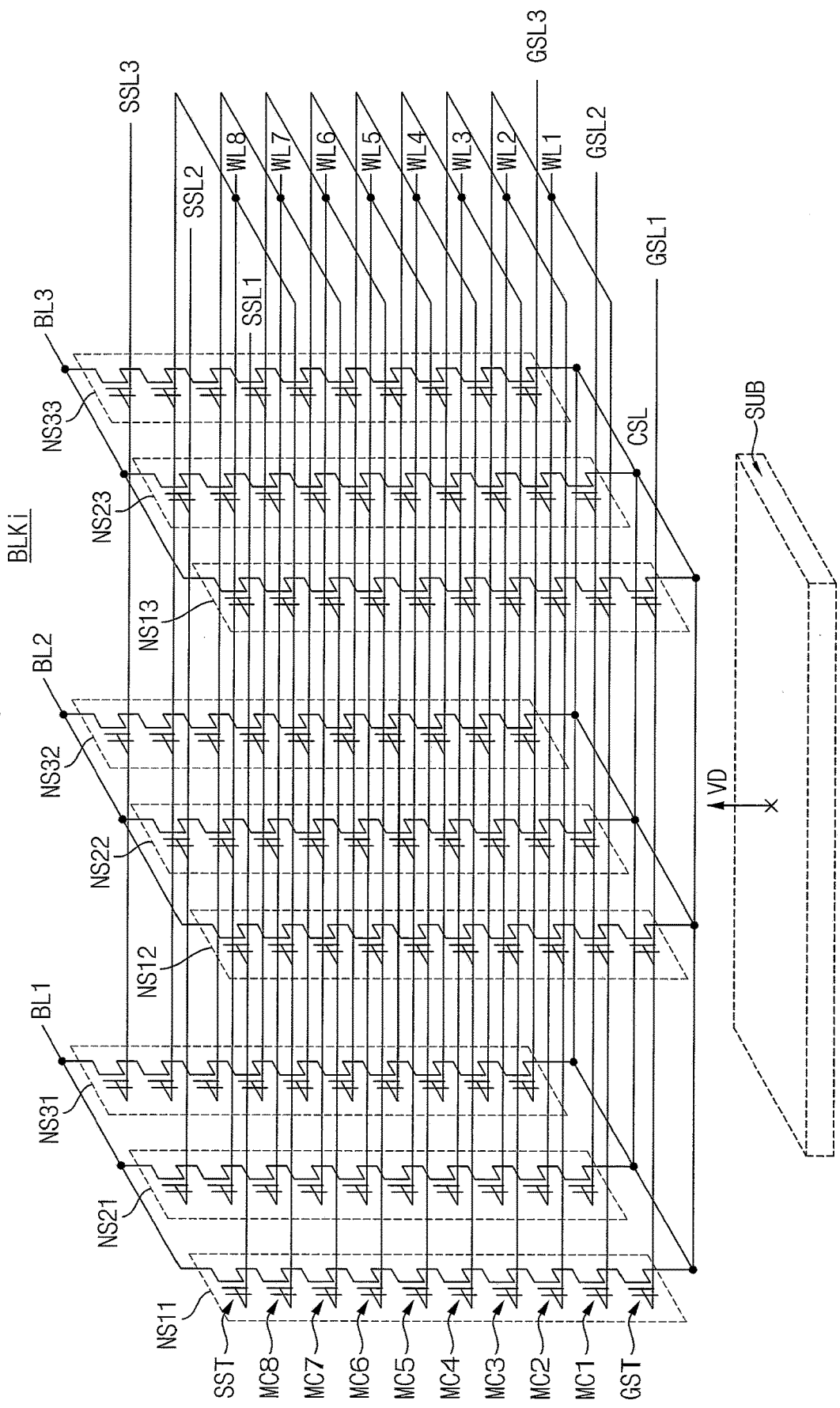
FIG. 9 is a circuit diagram illustrating one of the memory blocks of FIG. 8.

FIG. 9 is a circuit diagram illustrating one of the memory blocks of FIG. 8.

The memory block BLKi of FIG. 9 may be formed on a substrate SUB in a three-dimensional structure (or a vertical structure). For example, a plurality of memory cell strings included in the memory block BLKi may be formed in the vertical direction VD perpendicular to the substrate SUB.

Referring to FIG. 9, the memory block BLKi may include memory cell strings NS11 to NS31, NS12 to NS32, and NS13 to NS33 coupled between respective bit-lines BL1, BL2 and BL3 and a common source line CSL. Each of the memory cell strings NS11 to NS31, NS12 to NS32, and NS13 to NS33 may include a string selection transistor SST, a plurality of memory cells MC1 to MC8, and a ground selection transistor GST. In FIG. 9, each of the memory cell strings NS11 to NS31, NS12 to NS32, and NS13 to NS33 is illustrated to include eight memory cells MC1 to MC8. However, inventive concepts are not limited thereto. In some example embodiments, each of the memory cell strings NS11 to NS31, NS12 to NS32, and NS13 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated.

Figure 10:
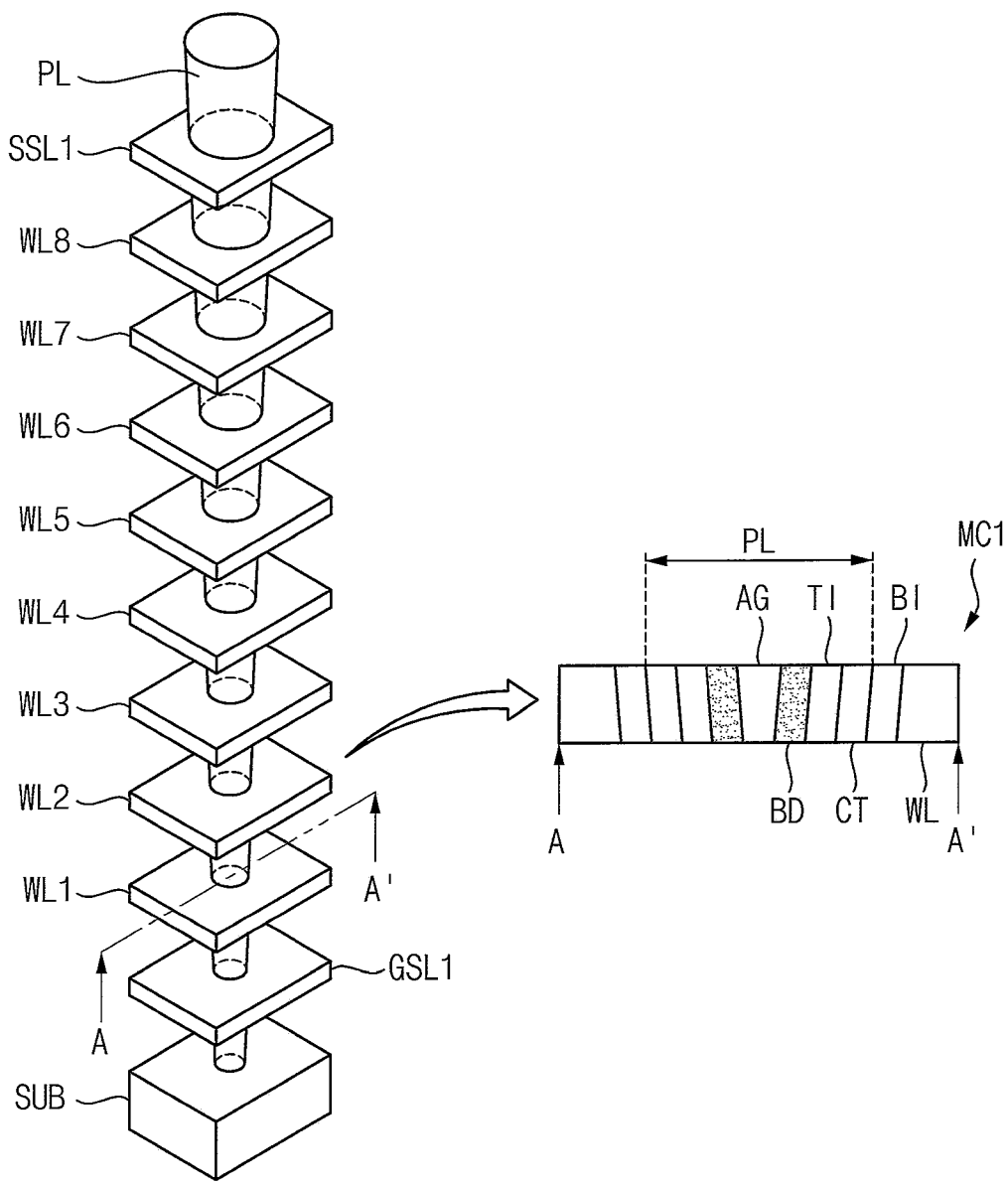
FIG. 10 illustrates an example of a structure of a cell string in the memory block of FIG. 9.

FIG. 10 illustrates an example of a structure of a memory cell string (e.g., NS11) in the memory block of FIG. 9.

Referring to FIGS. 9 and 10, in the memory cell string NS11, a pillar PL is provided on the substrate SUB such that the pillar PL extends in a direction perpendicular to the substrate SUB to make contact the substrate SUB. Each of the ground selection line GSL (e.g., GSL1), the word-lines WL1 to WL8, and the string selection line SSL (e.g., SSL1) illustrated in FIG. 10 may be formed of a conductive material parallel with the substrate SUB, for example, a metallic material. The pillar PL may be in contact with the substrate SUB through the conductive materials forming the string selection line SSL1, the word-lines WL1 to WL8, and the ground selection line GSL1.

A sectional view taken along a line A-A' is also illustrated in FIG. 10. In some example embodiments, a sectional view of a first memory cell MC1 corresponding to a first word-line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word-line WL1 and the pillar PL. The body BD, the tunnel insulating layer TI, the charge trap layer CT, the blocking insulating layer BI, and the first word-line WL1 may constitute or be included in a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

FIG. 11 is a schematic diagram of a connection of the memory cell array to the page buffer circuit in FIG. 6, according to example embodiments.

Referring to FIG. 11, the memory cell array 200 may include first through (n+1)th NAND strings NS0 through NSn, each of the first through (n+1)th NAND strings NS0 through NSn may include a ground select transistor GST connected to the ground select line GSL, a plurality of memory cells MC respectively connected to the first through (m+1)th word-lines WL0 through WLm, and a string select transistor SST connected to the string select line SSL, and the ground select transistor GST, the plurality of memory cells MC, and the string select transistor SST may be connected to each other in series. In this case, m may be a positive integer.

The page buffer circuit 410 may include first through (n+1)th page buffer units PBU0 through PBUn. The first page buffer unit PB0 may be connected to the first NAND string NS0 via the first bit-line BL0, and the (n+1)th page buffer unit PBUn may be connected to the (n+1)th NAND string NSn via the (n+1)th bit-line BLn. In this case, n may be a positive integer. For example, n may be 7, and the page buffer circuit 410 may have a structure in which page buffer units of eight stages, or, the first through (n+1)th page buffer units PBU0 through PBUn are in a line. For example, the first through (n+1)th page buffer units PBU0 through PBUn may be in a line in an extension direction of each of the first through (n+1)th bit-lines BL0 through BLn.

The page buffer circuit 410 may further include first through (n+1)th cache latches CL0 through CLn respectively corresponding to the first through (n+1)th page buffer units PBU0 through PBUn. For example, the page buffer circuit 410 may have a structure in which the cache latches of eight stages or the first through (n+1)th cache latches CL0 through CLn in a line. Although not shown, the first through (n+1)th cache latches CL0 through CLn may be in a line in an extension direction of each of the first through (n+1)th bit-lines BL0 through BLn.

The sensing nodes of each of the first through (n+1)th page buffer units PBU0 through PBUn may be commonly connected to a combined sensing node SOC. In addition, the first through (n+1)th cache latches CL0 through CLn may be commonly connected to the combined sensing node SOC. Accordingly, the first through (n+1)th page buffer units PBU0 through PBUn may be connected to the first through (n+1)th cache latches CL0 through CLn via the combined sensing node SOC.

Figure 12:
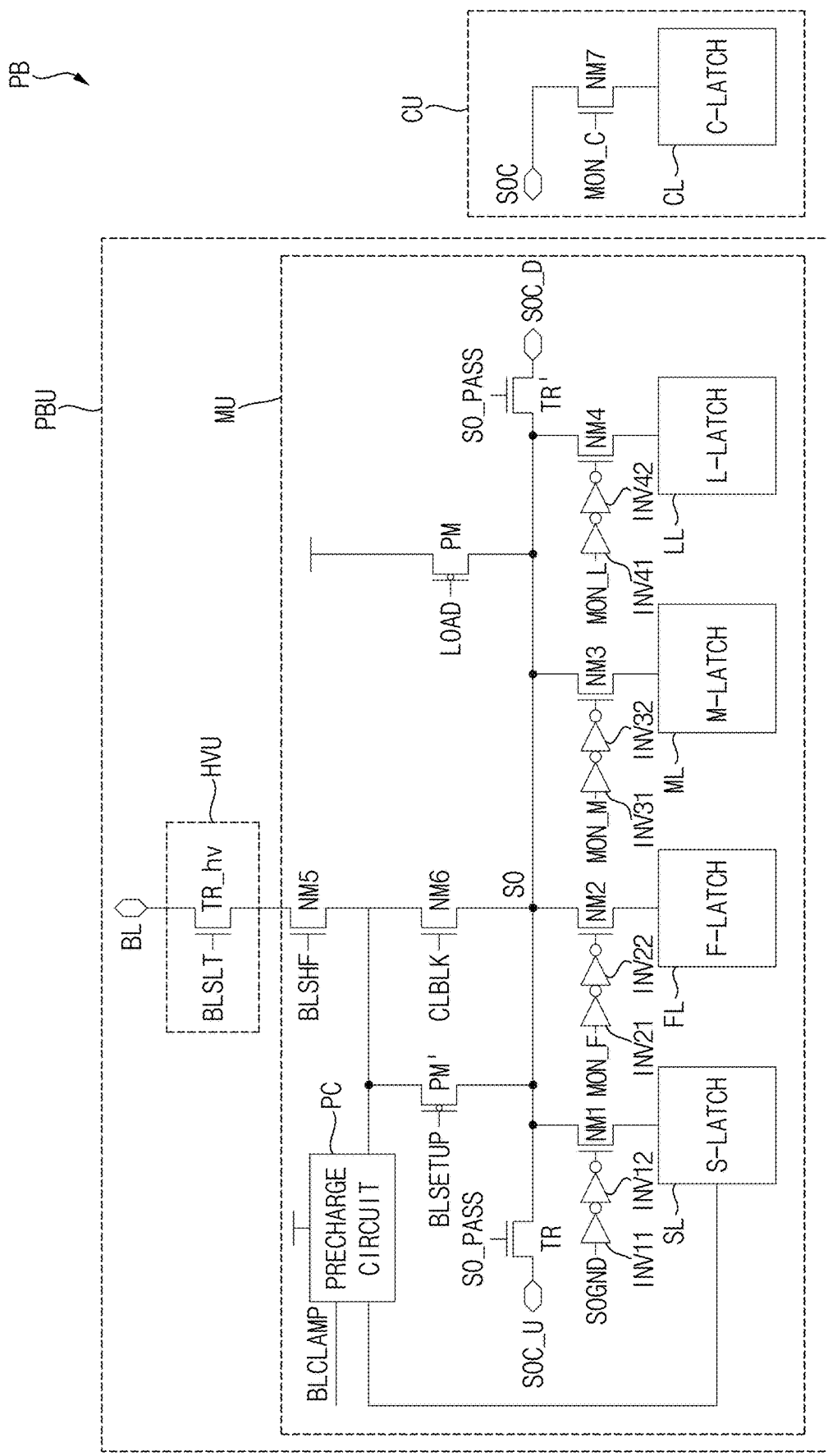
FIG. 12 illustrates in detail a page buffer according to example embodiments.

FIG. 12 illustrates in detail a page buffer according to example embodiments.

Referring to FIG. 12, the page buffer PB may correspond to an example of the page buffer PB in FIG. 6. The page buffer PB may include a page buffer unit PBU and a cache unit CU. Because the cache unit CU includes a cache latch (C-LATCH) CL, and the C-LATCH CL is connected to a data input/output line, the cache unit CU may be adjacent to the data input/output line. Accordingly, the page buffer unit PBU and the cache unit CU may be apart from each other, and the page buffer PB may have a structure in which the page buffer unit PBU and the cache unit CU are apart from each other.

The page buffer unit PBU may include a main unit MU. The main unit MU may include main transistors in the page buffer PB. The page buffer unit PBU may further include a bit-line selection transistor TR_hv that is connected to the bit-line BL and driven by a bit-line selection signal BLSLT. The bit-line select transistor TR_hv may include a high voltage transistor, and accordingly, the bit-line selection transistor TR_hv may be in a different well region from the main unit MU, that is, in a high voltage unit HVU.

The main unit MU may include a sensing latch (S-LATCH) SL, a force latch (F-LATCH) FL, an upper bit latch (M-LATCH) ML and a lower bit latch (L-LATCH) LL. According to an embodiment, the S-LATCH SL, the F-LATCH FL, the M-LATCH ML, or the L-LATCH LL may be referred to as main latches. The main unit MU may further include a precharge circuit PC capable of controlling a precharge operation on the bit-line BL or a sensing node SO based on a bit-line clamping control signal BLCLAMP, and may further include a transistor PM' driven by a bit-line setup signal BLSETUP.

The S-LATCH SL may, during a read operation or a program verification operation, store data stored in a memory cell MC or a sensing result of a threshold voltage of the memory cell MC. In addition, the S-LATCH SL may, during a program operation, be used to apply a program bit-line voltage or a program inhibit voltage to the bit-line BL. The F-LATCH FL may be used to improve threshold voltage distribution during the program operation. The F-LATCH FL may store force data. After the force data is initially set to '1', the force data may be converted to '0' when the threshold voltage of the memory cell MC enters a forcing region that has a lower voltage than a target region. By utilizing the force data during a program execution operation, the bit-line voltage may be controlled, and the program threshold voltage distribution may be formed narrower.

The M-LATCH ML, the L-LATCH LL, and the C-LATCH CL may be utilized to store data externally input during the program operation, and may be referred to as data latches. When data of 3 bits is programmed in one memory cell MC, the data of 3 bits may be stored in the M-LATCH ML, the L-LATCH LL, and the C-LATCH CL, respectively. Until a program of the memory cell MC is completed, the M-LATCH ML, the L-LATCH LL, and the C-LATCH CL may maintain the stored data. In addition, the C-LATCH CL may receive data read from a memory cell MC during the read operation from the S-LATCH SL, and output the received data to the outside via the data input/output line.

In addition, the main unit MU may further include first through fourth transistors NM1 through NM4 and a plurality of inverters INV11, INV12, INV21, INV22, INV31, INV32, INV41 and INV42. The first transistor NM1 may be connected between the sensing node SO and the S-LATCH SL, and may be driven by a ground control signal SOGND passing through the inverters INV11 and INV12. The second transistor NM2 may be connected between the sensing node SO and the F-LATCH FL, and may be driven by a forcing monitoring signal MON_F passing through the inverters INV21 and INV22. The third transistor NM3 may be connected between the sensing node SO and the M-LATCH ML, and may be driven by a higher bit monitoring signal MON_M passing through the inverters INV31 and INV32. The fourth transistor NM4 may be connected between the sensing node SO and the L-LATCH LL, and may be driven by a lower bit monitoring signal MON_L passing through the inverters INV41 and INV42.

In addition, the main unit MU may further include fifth and sixth transistors NM5 and NM6 connected to each other in series between the bit-line selection transistor TV_hv and the sensing node SO. The fifth transistor NM5 may be driven by a bit-line shut-off signal BLSHF, and the sixth transistor NM6 may be driven by a bit-line connection control signal CLBLK. In addition, the main unit MU may further include a precharge transistor PM. The precharge transistor PM may be connected to the sensing node SO, driven by a load signal LOAD, and precharge the sensing node SO to a precharge level in a precharge period.

In an embodiment, the main unit MU may further include a pair of pass transistors connected to the sensing node SO, or first and second pass transistors TR and TR'. According to an embodiment, the first and second pass transistors TR and TR' may also be referred to as first and second sensing node connection transistors, respectively. The first and second pass transistors TR and TR' may be driven in response to a pass control signal SO_PASS. According to an embodiment, the pass control signal SO_PASS may be referred to as a sensing node connection control signal. The first pass transistor TR may be connected between a first terminal SOC_U and the sensing node SO, and the second pass transistor TR' may be connected between the sensing node SO and a second terminal SOC_D.

For example, when the page buffer unit PBU corresponds to the second page buffer unit PBU1 in FIG. 11, the first terminal SOC_U may be connected to one end of the pass transistor included in the first page buffer unit PBU0, and the second terminal SOC_D may be connected to one end of the pass transistor included in the third page buffer unit PBU2. In this manner, the sensing node SO may be electrically connected to the combined sensing node SOC via pass transistors included in each of the third through (n+1)th page buffer units PBU2 through PBUn.

During the program operation, the page buffer PB may verify whether the program is completed in a memory cell MC selected among the memory cells MC included in the NAND string connected to the bit-line BL. The page buffer PB may store data sensed via the bit-line BL during the program verify operation in the S-LATCH SL. The M-LATCH ML and the L-LATCH LL may be set in which target data is stored according to the sensed data stored in the S-LATCH SL.

For example, when the sensed data indicates that the program is completed, the M-LATCH ML and the L-LATCH LL may be switched to a program inhibit setup for the selected memory cell MC in a subsequent program loop. The C-LATCH CL may temporarily store input data provided from the outside. During the program operation, the target data to be stored in the C-LATCH CL may be stored in the M-LATCH ML and the L-LATCH LL.

Hereinafter, assuming that signals for controlling elements in the page buffer circuit 410 are included in the page buffer control signal PCTL in FIG. 6.

Figure 13:
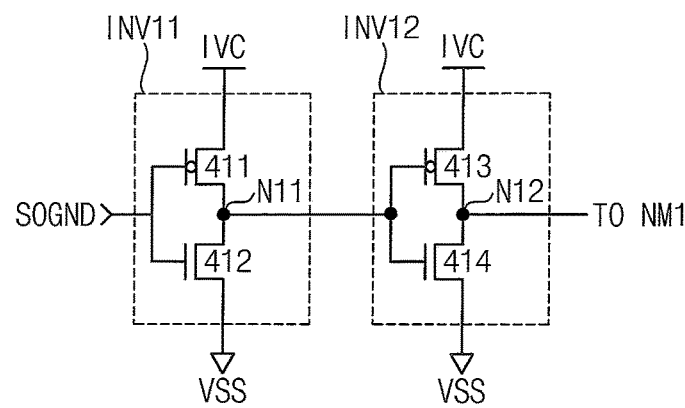
FIG. 13 illustrates two inverters which are connected in series in FIG. 12 according to example embodiments.

FIG. 13 illustrates two inverters which are connected in series in FIG. 12 according to example embodiments.

In FIG. 13, there are illustrated inverters INV11 and INV12 applying the ground control signal SOGND to the first transistor NM1.

Referring to FIG. 13, the inverter IVN11 may include a p-channel metal-oxide semiconductor PMOS transistor 411 and an n-channel metal-oxide semiconductor NMOS transistor 412 which are connected in series between the internal voltage IVC and a ground voltage VSS (e.g., 0V). The inverter IVN12 may include a PMOS transistor 413 and an NMOS transistor 414 which are connected in series between the internal voltage IVC and the ground voltage VSS.

The PMOS transistor 411 is connected between the internal voltage IVC and a node N11 and NMOS transistor 412 is connected between the node N11 and the ground voltage VSS. The ground control signal SOGND is applied to gates of the PMOS transistor 411 and the NMOS transistor 412. Therefore, the inverter INV11 inverts the ground control signal SOGND.

The PMOS transistor 413 is connected between the internal voltage IVC and a node N12 and NMOS transistor 414 is connected between the node N12 and the ground voltage VSS. An output of the inverter INV11 is applied to gates of the PMOS transistor 413 and the NMOS transistor 414. Therefore, the inverter INV12 inverts output of the inverter INV11 and applies the inverted output to the gate of the first transistor NM1.

Figure 14:
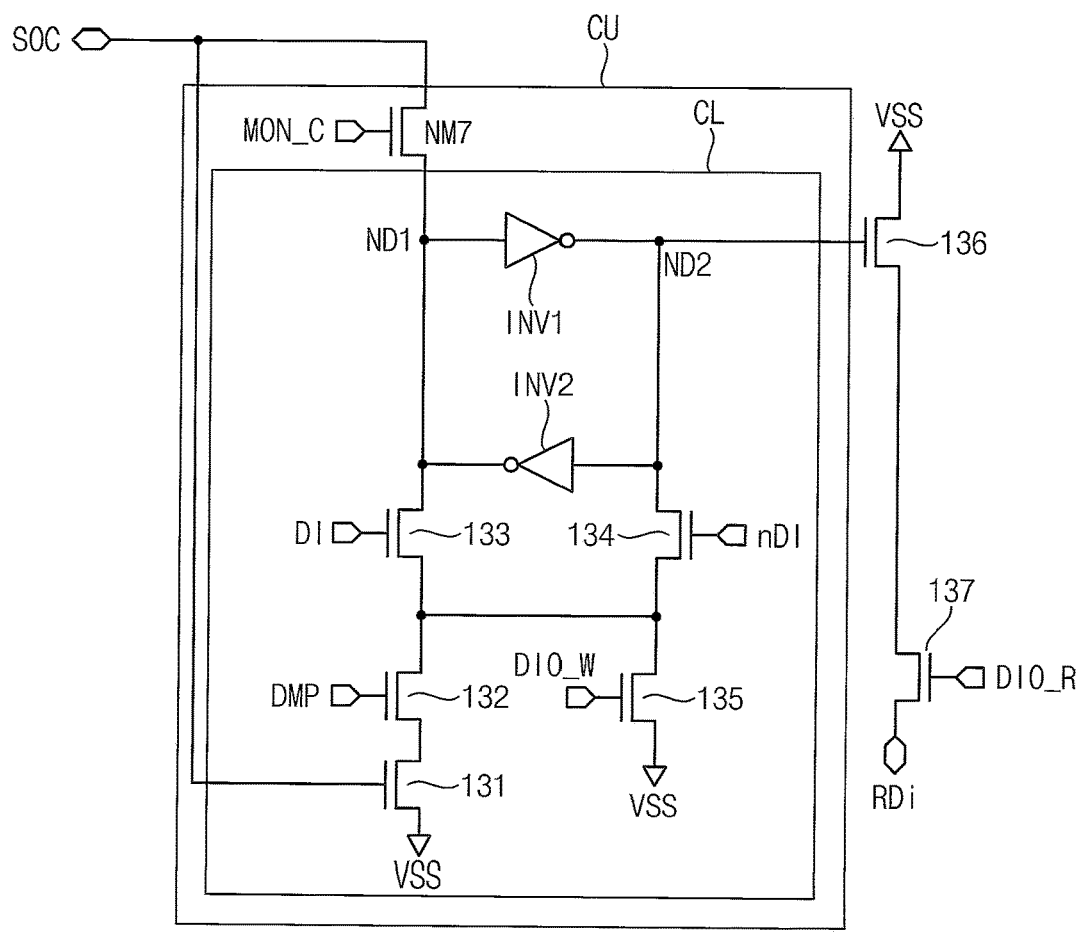
FIG. 14 is a circuit diagram illustrating an example of the cache unit according to example embodiments.

FIG. 14 is a circuit diagram illustrating an example of the cache unit according to example embodiments.

Referring to FIGS. 11 and 14, the cache unit CU may include a monitor transistor NM7 and the C-LATCH CL, and the C-LATCH CL may include first and second inverters INV1 and INV2, a dump transistor 132, and transistors 131, 133, and 135. The monitor transistor NM7 may be driven based on the cache monitoring signal MON_C, and may control a connection between the combined sensing node SOC and the C-LATCH CL.

The first inverter INV1 may be connected between a first node ND1 and a second node ND2, the second inverter INV2 may be connected between the second node ND2 and the first node ND1, and thus, the first and second inverters INV1 and INV2 may form a latch. The transistor 131 may include a gate connected to the combined sensing node SOC.

The dump transistor 132 may be driven by a dump signal DMP, and may transmit data stored in the C-LATCH CL to a main latch, for example, the S-LATCH SL in the page buffer unit PBU. The transistor 133 may be driven by a data signal DI, a transistor 134 may be driven by a data inversion signal nDI, and the transistor 135 may be driven by a write control signal DIO_W. When the write control signal DIO_W is activated, voltage levels of the first and second nodes ND1 and ND2 may be determined based on the data signal DI and the data inversion signal nDI, respectively.

The cache unit CU may be connected to an data I/O line (or a data I/O terminal) RDi via transistors 136 and 137. The transistor 136 may include a gate connected to the second node ND2, and may be turned on or off based on a voltage level of the second node ND2. The transistor 137 may be driven by a read control signal DIO_R. When the read control signal DIO_R is activated and the transistor 137 is turned on, a voltage level of the input/output terminal RDi may be determined as '1' or '0' based on a state of the C-LATCH CL.

Figure 15:
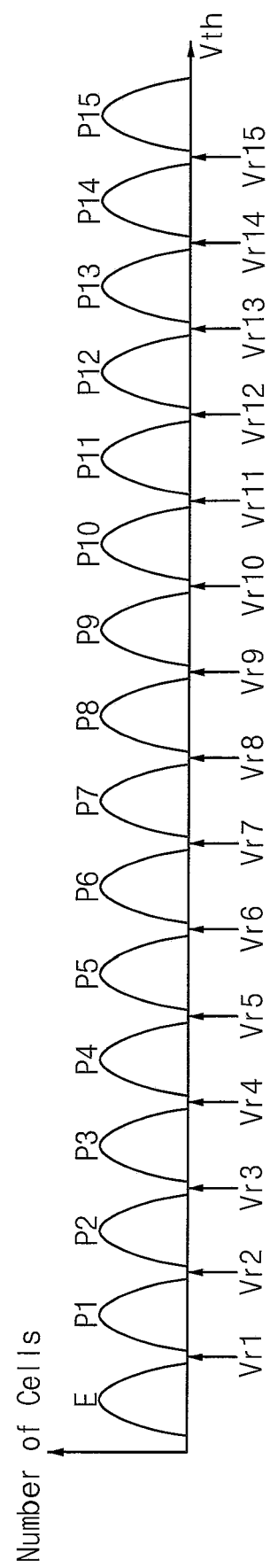
FIG. 15 is a graph showing a threshold voltage distribution of memory cells when a memory cell included in the memory cell array in FIG. 6 is a 4-bit quadrature level cell.

FIG. 15 is a graph showing a threshold voltage distribution of memory cells when a memory cell included in the memory cell array 200 in FIG. 6 is a 4-bit quadrature level cell (QLC).

Referring to FIG. 15, a horizontal axis represents a threshold voltage Vth and the vertical axis represents the number of memory cells. When each of the memory cells is a 4-bit quadrature level cell programmed to store 4 bits, the memory cell may have one from among an erase state E and first through fifteenth program states P1 through P15. When a memory cell is a multi-level cell, unlike a single-level cell, since an interval between threshold voltages distributions is small, a small change in the threshold voltage Vth may cause a problem.

A first read voltage Vr1 has a voltage level between a distribution of a memory cell having the erase state E and a distribution of a memory cell having the first program state P1. Each of second through fifteenth read voltages Vr2 through Vr15 have a voltage level between distributions of memory cells having adjacent program states.

In example embodiments, assuming that the first read voltage Vr1 is applied, when a memory cell is turned on, data '1' may be stored, and when the memory cell is turned off, data '0' may be stored. However, the present disclosures are not limited thereto, and other example embodiments, assuming that the first read voltage Vr1 is applied, when a memory cell is turned on, data '0' may be stored, and when the memory cell is turned off, data '1' may be stored. As such, a logic level of data may vary according to the present disclosures.

Figure 16:
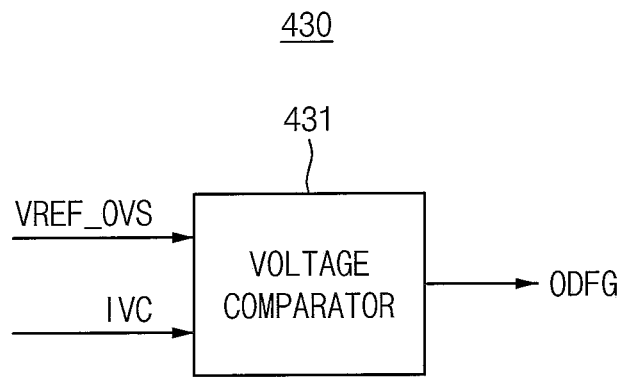
FIG. 16 is a block diagram illustrating an example of the overshoot detector in the nonvolatile memory device of FIG. 6 according to example embodiments.

FIG. 16 is a block diagram illustrating an example of the overshoot detector in the nonvolatile memory device of FIG. 6 according to example embodiments.

Referring to FIG. 16, the overshoot detector 430 may include a voltage comparator 431.

The voltage comparator 431 may compare the internal voltage IVC with a reference voltage VREF_OVS corresponding to a reference for detecting an overshoot, may generate the overshoot detection flag ODFG that is activated in response to a level of the internal voltage IVC being equal to or greater than the reference voltage VREF_OVS based on a result of the comparison and may provide the overshoot detection flag ODFG to the control circuit 450.

In example embodiments, the control circuit 450 may set the discharge period based on the overshoot detection flag ODFG. The control circuit 450 may set a starting time point and an ending time point of the discharge period based on the overshoot detection flag ODFG.

Figure 17:
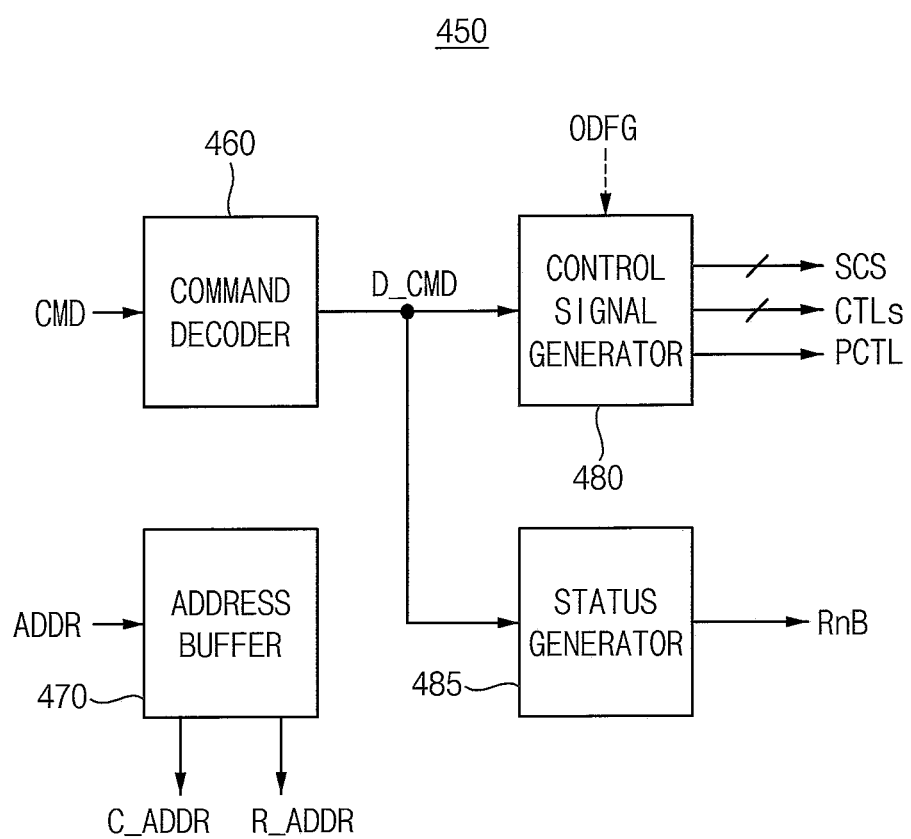
FIG. 17 is a block diagram illustrating the control circuit in the nonvolatile memory device of FIG. 6 according to example embodiments.

FIG. 17 is a block diagram illustrating the control circuit in the nonvolatile memory device of FIG. 6 according to example embodiments.

Referring to FIG. 17, the control circuit 450 may include a command decoder 460, an address buffer 470, a control signal generator 480 and a status signal generator 485.

The command decoder 460 may decode the command CMD and provide a decoded command D_CMD to the control signal generator 480 and the status signal generator 485.

The address buffer 470 may receive the address signal ADDR, provide the row address R_ADDR to the address decoder 300 and provide the column address C_ADDR to the data I/O circuit 420.

The control signal generator 480 may receive the decoded command D_CMD, may generate the control signals CTLs based on an operation directed by the decoded command D_CMD and provide the control signals CTLs to the voltage generation circuit 500. The control signal generator 480 may generate the page buffer control signal PCTL based on an operation directed by the decoded command D_CMD to provide the page buffer control signal PCTL to the page buffer circuit 410, and may generate the switching control signals SCS to provide the switching control signals SCS to the address decoder 300.

The status signal generator 485 may receive the decoded command D_CMD, may monitor an operation directed by the decoded command D_CMD and may transition the status signal RnB indicating one of a ready state or a busy state based on whether the operation directed by the decoded command D_CMD is completed.

Figure 18:
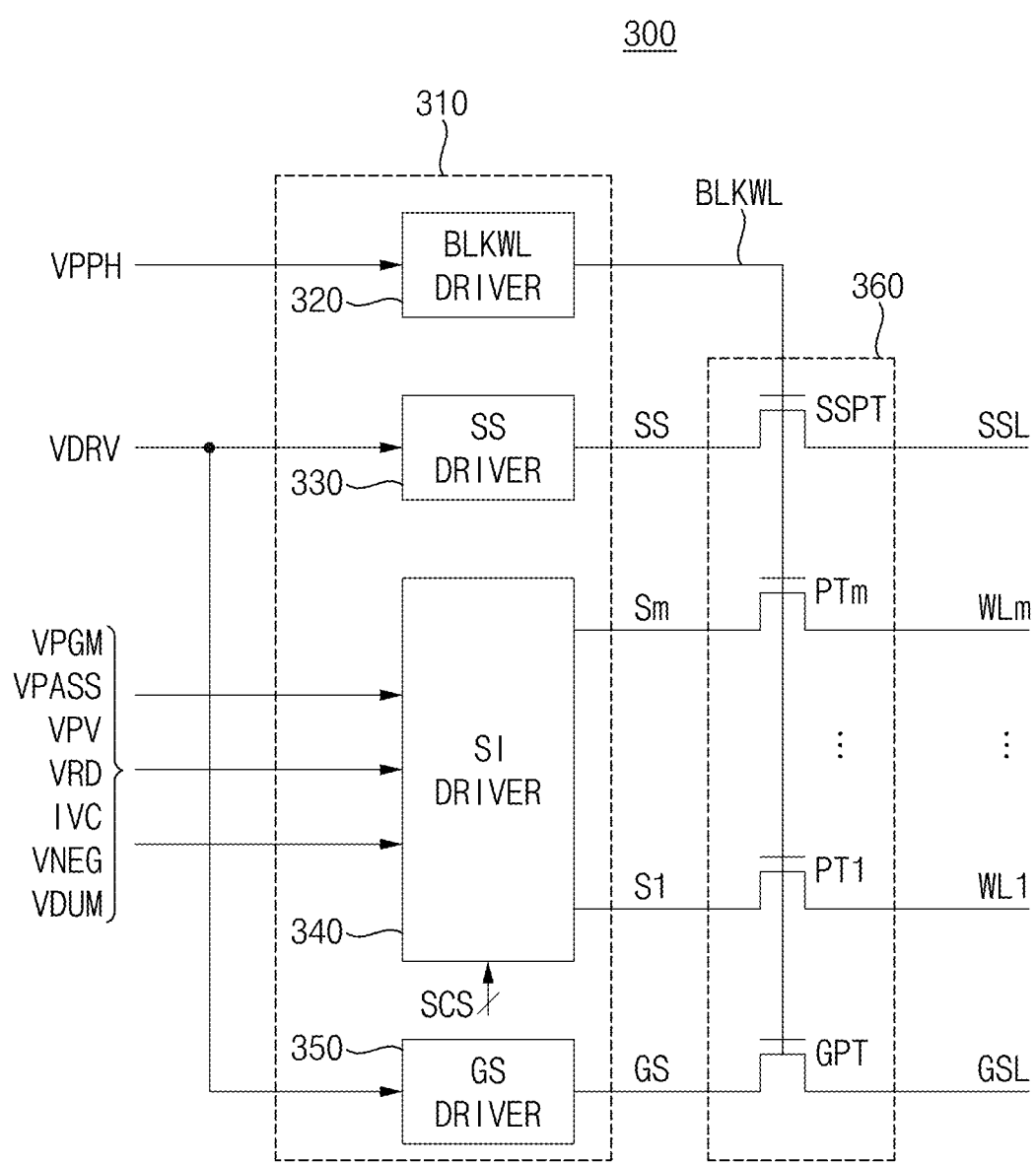
FIG. 18 is a block diagram illustrating an example of the address decoder in the nonvolatile memory device of FIG. 6 according to example embodiments.

FIG. 18 is a block diagram illustrating an example of the address decoder in the nonvolatile memory device of FIG. 6 according to example embodiments.

Referring to FIG. 18, the address decoder 300 may include a driver circuit 310 and a pass switch circuit 360.

The driver circuit 310 may transfer voltages provided from the voltage generation circuit 500 to the memory cell array 200 in response to a block address. The driver circuit 310 may include a block selection driver BLKWL DRIVER 320, a string selectin driver SS DRIVER 330, a driving line driver SI DRIVER 340 and a ground selection driver GS DRIVER 350.

The block selection driver 320 may supply a high voltage VPPH from the voltage generation circuit 500 to the pass transistor circuit 360 in response to the block address. The block selection driver 320 may supply the high voltage VPPH to a block word-line BLKWL coupled to gates of a plurality of pass transistors GPT, PT1~PTm and SSPT in the pass transistor circuit 360. Here, m is an integer greater than one. The block selection driver 320 may control the application of various voltages such as a pass voltage, a program voltage, a read voltage to the memory cell array 200.

The string selection driver 330 may supply a driving voltage VDRV from the voltage generation circuit 500 to the string selection line SSL through the pass transistor SSPT and a string selection line (SSL) driving line SS. During a program operation, the string selection driver 330 may supply the driving voltage VDRV to the SSL driving line SS so as to turn on all string selection transistors in a selected memory block.

The driving line driver 340 may supply a program voltage VPGM, a pass voltage VPASS, a verification voltage VPV, a read voltage VRD, the internal voltage IVC, a dummy voltage VDUM, and a negative voltage VNEG from the voltage generation circuit 500 to word-lines WL1~WLm through word-line driving lines S1~Sm and the pass transistors PT1~PTm.

In example embodiments, the word-lines WL1~WLm may include at least one dummy word-line and normal word-lines. A dummy memory cell may be activated by a dummy word-line, but may not have any "data" stored to read from a device external. For instance, data stored in a dummy memory cell electrically connected to a dummy word-line may not be transmitted outside of the memory cell array through selection signals provided by the column decoder, as is the case for normal memory cells. For instance, a dummy memory cell electrically connected to a dummy word-line may not have any connection to a bit-line to transmit data there between as with normal memory cells. The dummy voltage VDUM may be applied to the dummy word-line according to operation of the nonvolatile memory device 100.

The ground selection driver 350 may supply a driving voltage to the ground selection line GSL through the pass transistor GPT and a ground selection line (GSL) driving line GS.

The pass transistors GPT, PT1~PTm and SSPT are configured such that the ground selection line GSL, the word-lines WL1~WLm and the string selection line SSL are electrically connected to corresponding driving lines, in response to activation of the high voltage VPPH on the block word-line BLKWL. In example embodiments, each of the pass transistors GPT, PT1~PTm, and SSPT may include a high voltage transistor capable of enduring high-voltage.

Figure 19:
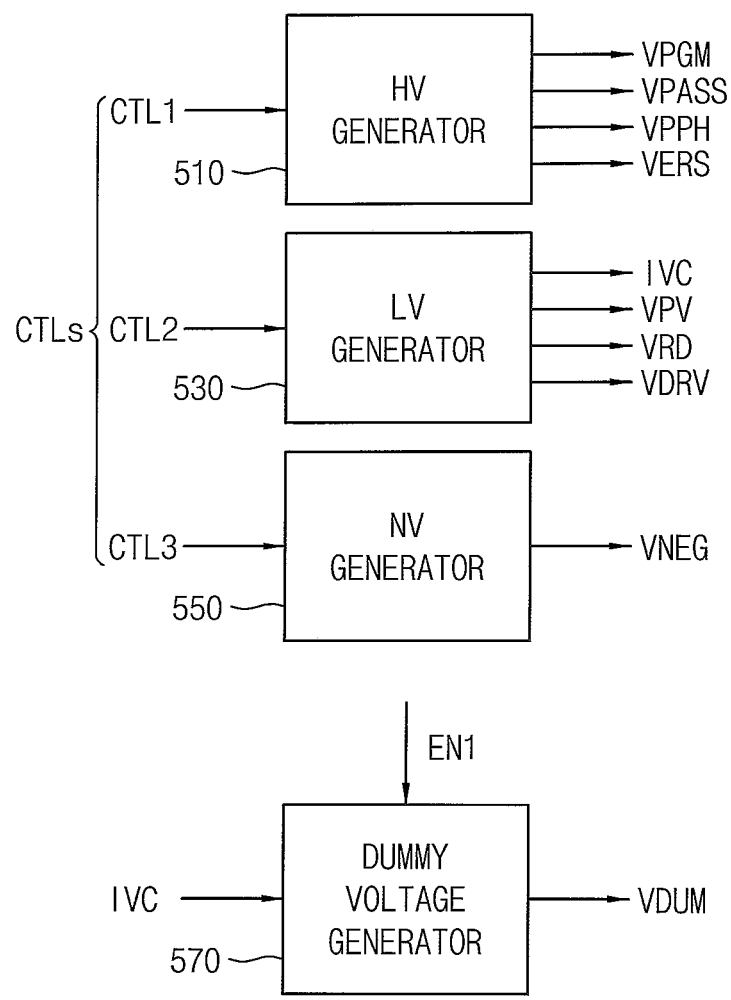
FIG. 19 is a block diagram illustrating the voltage generator in the nonvolatile memory device of FIG. 6 according to example embodiments.

FIG. 19 is a block diagram illustrating the voltage generator in the nonvolatile memory device of FIG. 6 according to example embodiments.

Referring to FIG. 19, the voltage generation circuit 500 may include a high voltage generator 510 and a low voltage generator 530. The voltage generation circuit 500 may further include a negative voltage generator 550 and a dummy voltage generator 570.

The high voltage generator 510 may generate the program voltage VPGM, the pass voltage VPASS, the high voltage VPPH and an erase voltage VERS according to operations directed by the command CMD, in response to a first control signal CTL1.

The program voltage VPGM is applied to a selected word-line, the pass voltage VPASS may be applied to unselected word-lines, the erase voltage VERS may be applied to a well of the memory block or each drain of pass transistors coupled to a bit-line and a common source line. The high voltage VPPH may be applied to each gate of pass transistors coupled to word-lines, a string selection line and a ground selection line. The first control signal CTL1 may include a plurality of bits which indicate the operations directed by the decoded command D_CMD.

The low voltage generator 530 may generate the program verification voltage VPV, the read voltage VRD, the driving voltage VDRV, and the internal voltage IVC according to operations directed by the command CMD, in response to a second control signal CTL2. The program verification voltage VPV and the read voltage VRD may be applied to the selected word-line according to operation of the nonvolatile memory device 100. The internal voltage IVC may be applied to the unselected word-lines in recovering the unselected word-lines during the read operation. The driving voltage VDRV may be applied to the selected string selection line SSL and the selected ground selection line GSL according to operation of the nonvolatile memory device 100. The second control signal CTL2 may include a plurality of bits which indicate the operations directed by the decode command D_CMD.

The negative voltage generator 550 may generate a negative voltage VNEG which has a negative level according to operations directed by the command CMD, in response to a third control signal CTL3. The third control signal CTL3 may include a plurality of bits which indicate the operations directed by the decoded command D_CMD. The negative voltage VNEG may be applied to a selected word-line and unselected word-lines during a program recovery period and may be applied to the unselected word-lines during a bit-line set-up period.

The dummy voltage generator 570 may be enabled in response to a first enable signal EN1, and may generate the dummy voltage VDUM based on the internal voltage IVC. The control circuit 450 in FIG. 6 may enable the dummy voltage generator 570 when testing the nonvolatile memory device 100 or in the discharge period of the word-line recovery operation by activating the first enabling signal EN1.

Figure 20:
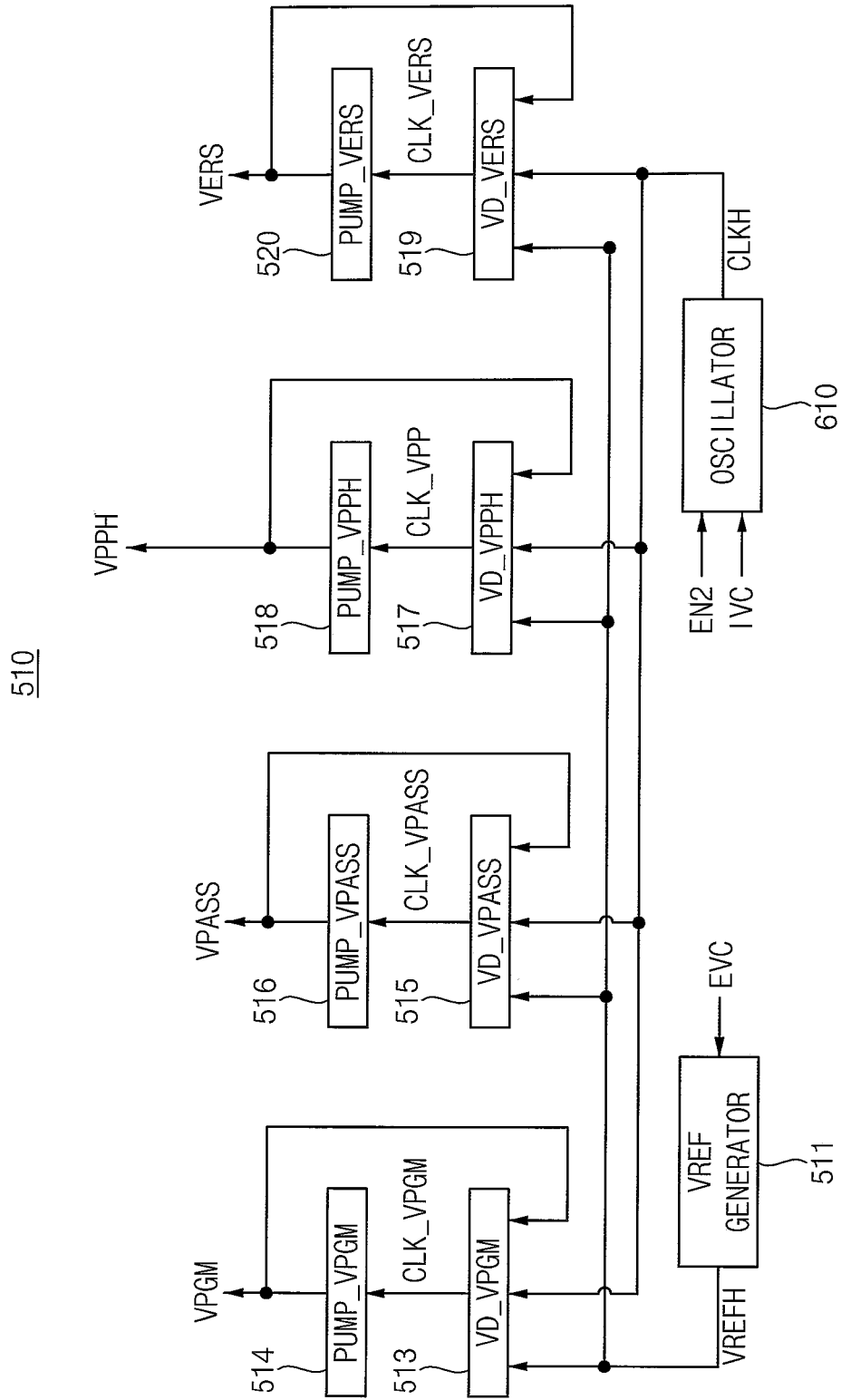
FIG. 20 is a block diagram illustrating an example of the high voltage generator in the voltage generation circuit of FIG. 19 according to example embodiments.

FIG. 20 is a block diagram illustrating an example of the high voltage generator in the voltage generation circuit of FIG. 19 according to example embodiments.

Referring to FIG. 20, the high voltage generator 510 may include a reference voltage generator 511, an oscillator 610, a program voltage detector VD_VPGM 513, a program voltage pump PUMP_VPGM 514, a pass voltage detector VD_VPASS 515, a pass voltage pump PUMP_VPASS 516, a high voltage detector VD_VPPH 517, a high voltage pump PUMP_VPPH 518, an erase voltage detector VD_VERS 519, and an erase voltage pump PUMP_VERS 520.

The reference voltage generator 511 may generate one or more reference voltages VREFH based on the external voltage EVC. The oscillator 610 may generate a clock signal CLKH based on the internal voltage IVC.

The program voltage detector 513 may receive the reference voltage VREFH and the clock signal CLKH, detect the program voltage VPGM and generate a program voltage clock CLK_VPGM. The program voltage pump 514 may generate the program voltage VPGM by operating a boosting circuit based on the program voltage clock CLK_VPGM.

The pass voltage detector 515 may receive the reference voltage VREFH and the clock signal CLKH, detect the pass voltage VPASS and generate a pass voltage clock CLK_VPASS. The pass voltage pump 516 may generate the pass voltage VPASS by operating a boosting circuit based on the pass voltage clock CLK_VPASS.

The high voltage detector 517 may receive the reference voltage VREFH and the clock signal CLKH, detect the high voltage VPPH and generate a high voltage clock CLK_VPPH. The high voltage pump 518 may generate the high voltage VPPH by operating a boosting circuit based on the high voltage clock CLK_VPPH.

The erase voltage detector 519 may receive the reference voltage VREFH and the clock signal CLKH, detect the erase voltage VERS and generate an erase voltage clock CLK_VERS. The erase voltage pump 520 may generate the erase voltage VERS by operating a boosting circuit based on the erase voltage clock CLK_VERS.

In example embodiments, a voltage level of the reference voltage VREFH applied to the program voltage detector VD_VPGM 513, the pass voltage detector VD_VPASS 515, the high voltage detector VD_VPPH 517, and the erase voltage detector VD_VERS 519 may be different from each other. For example, a voltage level of the reference voltage VREFH applied to the program voltage detector VD_VPGM 513 is higher than a voltage level of the reference voltage VREFH applied to the pass voltage detector VD_VPASS.

Although not shown in FIG. 20, at least one of the program voltage detector VD_VPGM 513, the program voltage pump PUMP_VPGM 514, the pass voltage detector VD_VPASS 515, the pass voltage pump PUMP_VPASS 516, the high voltage detector VD_VPPH 517, the high voltage pump PUMP_VPPH 518, the erase voltage detector VD_VERS 519, and the erase voltage pump PUMP_VERS 520 of the high voltage generator 510 may be applied with the internal voltage IVC.

The control circuit 450 in FIG. 6 may control the oscillator 610 to consume the internal voltage IVC by providing a second enable signal EN2 to the oscillator 610 when recovering the unselected word-lines in the discharge period within the word-line recovery period during the read operation.

Figure 21:
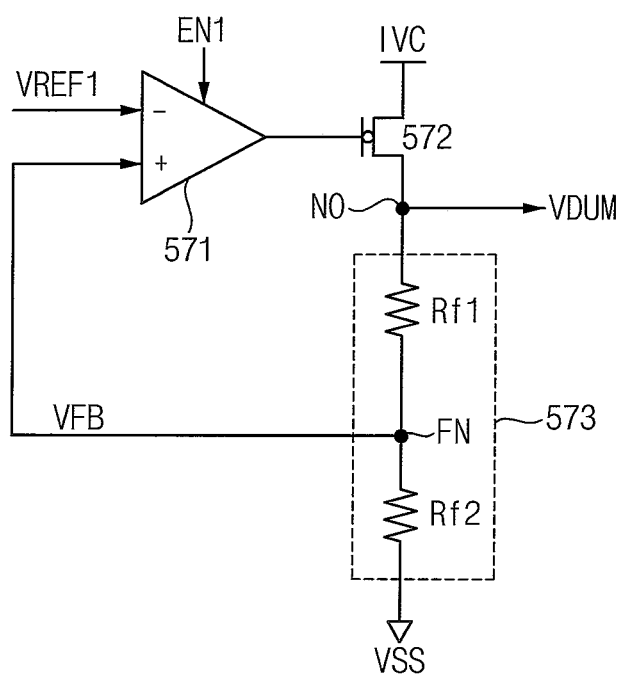
FIG. 21 is a circuit diagram illustrating an example of the dummy voltage generator in the voltage generation circuit of FIG. 19 according to example embodiments.

FIG. 21 is a circuit diagram illustrating an example of the dummy voltage generator in the voltage generation circuit of FIG. 19 according to example embodiments.

Referring to FIG. 21, the dummy voltage generator 570 may include an operational amplifier 571, a PMOS transistor 572 and a feedback circuit 573.

The operational amplifier 571 may receive a feedback voltage VFB and a reference voltage VREF1 and may amplify a voltage difference between the feedback voltage VFB and the reference voltage VREF1 to output the amplified voltage difference.

The PMOS transistors 572 may include a source coupled to the internal voltage IVC, a drain coupled to an output node NO and a gate receiving an output of the operational amplifier 571. The PMOS transistors 572 may regulate the internal voltage IVC based on the output of the operational amplifier 571 to output the dummy voltage VDUM at the output node NO.

The feedback circuit 573 may include a first feedback resistor Rf1 and a second feedback resistor Rf2 that are connected in series between the output node NO and the ground voltage VSS. The feedback circuit 573 may provide the operational amplifier 571 with the feedback voltage VFB by dividing the dummy voltage VDUM based on a ratio of the first feedback resistor Rf1 and the second feedback resistor Rf2 at a feedback node FN at which the first feedback resistor Rf1 and the second feedback resistor Rf2 are connected to each other.

For example, during a sensing period in the read operation, the dummy voltage VDUM may be applied to the dummy word-line included in the memory cell array 200 through the driving line driver 340 of FIG. 18.

Figure 22:
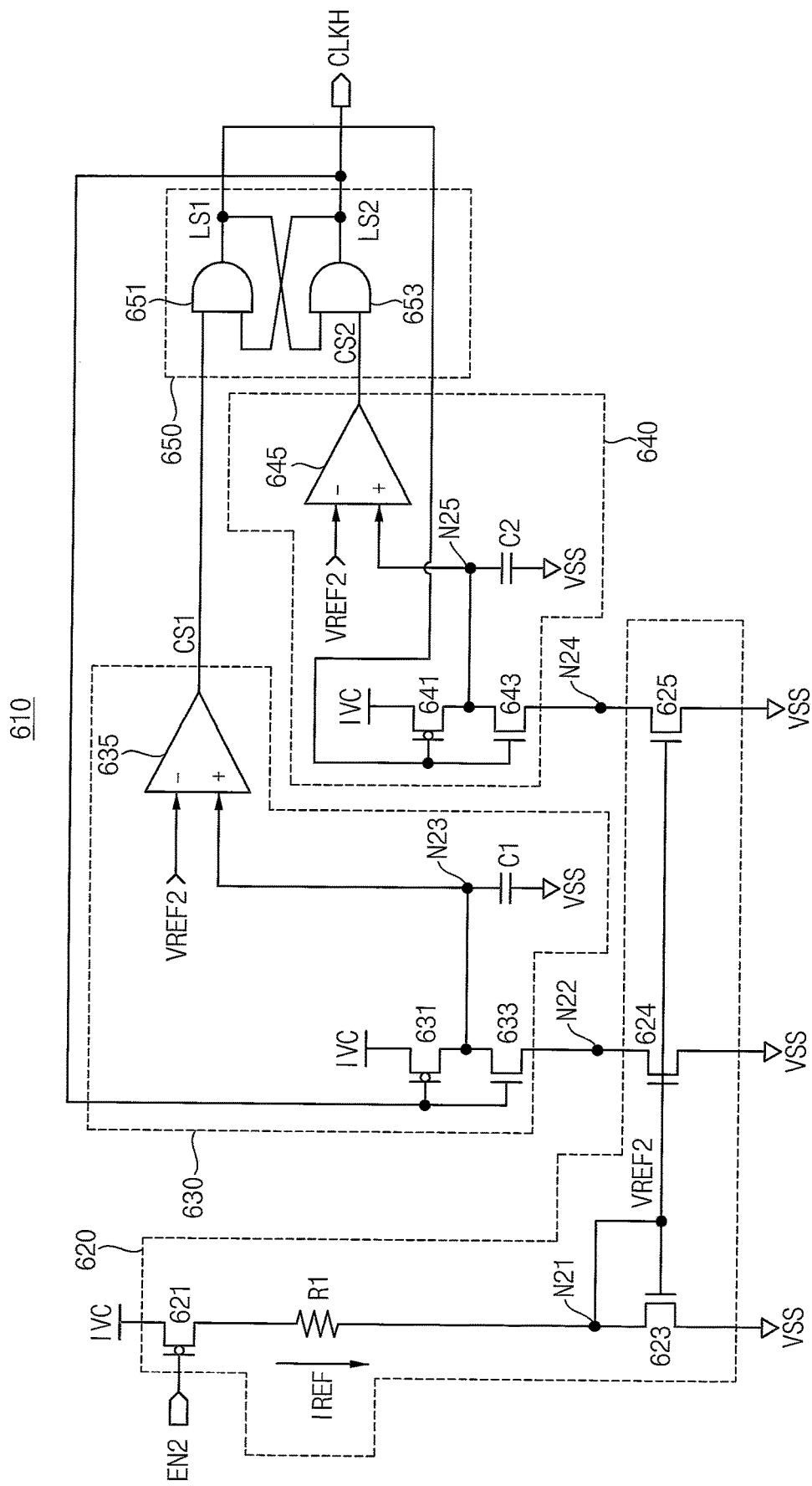
FIG. 22 is a circuit diagram illustrating an example of oscillator in the high voltage generator of FIG. 20 according to example embodiments.

FIG. 22 is a circuit diagram illustrating an example of oscillator in the high voltage generator of FIG. 20 according to example embodiments.

Referring to FIG. 22, the oscillator 610 may include a reference voltage generator 620, a first comparison circuit 630, a second comparison circuit 640 and a latch circuit 650.

The reference voltage generator 620 may generate a reference voltage VREF2 based on the internal voltage IVC and may provide the reference voltage VREF2 to the first comparison circuit 630 and the second comparison circuit 640.

The reference voltage generator 620 may include a PMOS transistor 621, a resistor R1 and NMOS transistors 623, 624 and 625.

The PMOS transistor 621 may include a source coupled to the internal voltage IVC, a gate receiving the second enable signal EN2 and a drain coupled to the resistor R1. The NMOS transistor 623 may include a drain coupled to the resistor R1 at a node N21, a gate coupled to the node N21 and a source coupled to the ground voltage VSS. The NMOS transistor 624 may include a drain coupled to the first comparison circuit 630 at a node N22, a gate coupled to the node N21 and a source coupled to the ground voltage VSS. The NMOS transistor 625 may include a drain coupled to the second comparison circuit 640 at a node N24, a gate coupled to the node N21 and a source coupled to the ground voltage VSS.

The NMOS transistor 623 and each of the NMOS transistor 624 and 625 may constitute a current mirror.

The PMOS transistor 621 may provide a reference current IREF to the node N21 through the resistor R1 in response to the second enable signal EN2. A reference voltage VREF2 is induced at the node N21 based on the reference current IREF. Therefore, a voltage level of the reference voltage VREF2 may be proportional to an activation interval of the second enable signal EN2.

The latch circuit 650 may include a first NAND gate 651 and a second NAND gate 653. The first NAND gate 651 may output a first latched signal LS1 by performing a NAND operation on a first comparison signal CS1 from the first comparison circuit 630 and a second latched signal LS2 from the second NAND gate 653. The second NAND gate 653 may output the second latched signal LS2 as the clock signal CLKH by performing a NAND operation on a second comparison signal CS2 from the second comparison circuit 640 and the first latched signal LS1 from the first NAND gate 651.

The first comparison circuit 630 may include a PMOS transistor 631, an NMOS transistor 633, an operational amplifier 635 and a capacitor C1.

The PMOS transistor 631 may be connected between the internal voltage IVC and a node N23 and may have a gate receiving the second latched signal LS2. The NMOS transistor 633 may be connected between the node N23 and the node N22 and may have a gate receiving the second latched signal LS2. The PMOS transistor 631 and the NMOS transistor 633 may invert the second latched signal LS2.

The capacitor C1 may be coupled between the node N23 and the ground voltage VSS and may store a voltage of the node N23. The operational amplifier 635 may compare the voltage of the node N23 with the reference voltage VREF2 and may output the first comparison signal CS1 based on a result of comparison.

The second comparison circuit 640 may include a PMOS transistor 641, an NMOS transistor 643, an operational amplifier 645 and a capacitor C2.

The PMOS transistor 641 may be connected between the internal voltage IVC and a node N25 and may have a gate receiving the first latched signal LS1. The NMOS transistor 643 may be connected between the node N25 and the node N24 and may have a gate receiving the first latched signal LS1. The PMOS transistor 641 and the NMOS transistor 643 may invert the first latched signal LS1.

The capacitor C2 may be coupled between the node N25 and the ground voltage VSS and may store a voltage of the node N25. The operational amplifier 645 may compare the voltage of the node N25 and the reference voltage VREF2 and may output the second comparison signal CS2 based on a result of comparison.

During an activation interval in which the second enable signal EN2 is activated at a logic low level, the NMOS transistors 624 and 625 are conducted in response to the reference voltage VREF2 and each source of the NMOS transistors 624 and 625 is connected to the ground voltage VSS. Therefore the oscillator 610 may output the second latched signal LS2 as the clock signal CLKH based on a result of comparing the second latched signal LS2 with the reference voltage VREF2 and a result of comparing the first latched signal LS1 with the reference voltage VREF2 during an activation interval in which the second enable signal EN2 is activated at a logic low level. Accordingly, the oscillator 610 may output the clock signal CLKH toggling during which the second enable signal EN2 is activated at a logic low level.

Figure 23:
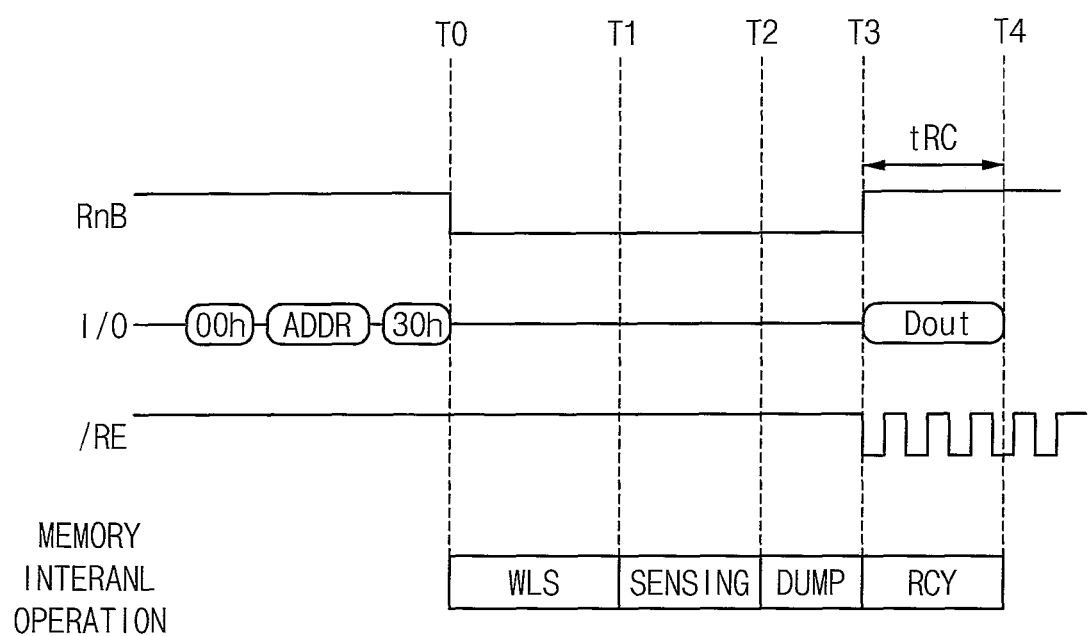
FIG. 23 is a timing diagram illustrating an operational example of the memory system of FIG. 5.

FIG. 23 is a timing diagram illustrating an operational example of the memory system of FIG. 5.

Referring to FIGS. 5 and 23, the memory controller 50 may fetch read data before word-line recovery of the nonvolatile memory device 100 is completed.

During a high-level (ready state) period of the status signal RnB, the memory controller 50 may issue a read command (00h, ADD, 30h) through a data I/O terminal I/O to the nonvolatile memory device 100. When an input of the read command is completed, the nonvolatile memory device 100 may transition the status signal RnB to a low level (busy state). Alternatively, the nonvolatile memory device 100 may be responsive to a status read command received through the data I/O terminal I/O to transmit the busy state to the memory controller 50.

The nonvolatile memory device 100 may generate a word-line voltage to be provided to a selected memory region in response to the read command, and the word-line voltage may be applied to the selected memory region. This word-line setup operation WLS may be performed during a word-line setup period corresponding to a time section T0 to T1 of FIG. 23. Then, the nonvolatile memory device 100 may sense and latch data of cells of the selected memory region. This sensing operation SENSING may be performed during a sensing period corresponding to a time section T1 to T2 of FIG. 23. The sensed data latched in the page buffer circuit 410 may be dumped to the data I/O circuit 420. This dump operation DUMP may be performed during a dump period corresponding to a time section T2 to T3 of FIG. 23. Herein, for convenience of description, the terms of the word-line setup operation WLS and a word-line setup period WLS, the terms of the sensing operation SENSING and a sensing period SENSING, and the terms of the dump operation DUMP and a dump period DUMP may be used interchangeably.

The nonvolatile memory device 100 may start a word-line recovery operation RCY at a point of time T3 when dumping of the sensed data to the data I/O circuit 420 is completed. This word-line recovery operation RCY may be performed during a word-line recovery period corresponding to a time section T3 to T4 of FIG. 23. Herein, for convenience of description, the terms of the word-line recovery operation RCY and the word-line recovery period RCY may be used interchangeably. Here, the word-line recovery operation may be performed to discharge a bulk, word-lines, bit-lines, selection lines, a common source line, etc. associated with the selected memory cells. Also, the nonvolatile memory device 100 may set the status signal RnB to a high level (ready state) at a point of time T3 when dumping of the sensed data to the data I/O circuit 420 is completed. To output data of the nonvolatile memory device 100 to an external device may be possible from a point of time when the status signal RnB transitions to a high level. If the memory controller 50 provides a read enable signal /RE to the nonvolatile memory device 100 in response to a low-to-high transition of the status signal RnB, the nonvolatile memory device 100 may output the dumped data. The nonvolatile memory device 100 may output the dumped data while toggling the read enable signal /RE.

Here, it is necessary to define a time when the sensed data is output during execution of the word-line recovery operation of the nonvolatile memory device 100. Although the status signal RnB is set to a high level, an external command should not be provided to the nonvolatile memory device 100 during a time section T3 to T4 when the word-line recovery operation of the nonvolatile memory device 100 is performed. In this case, although a command is provided from the memory controller 50 to the nonvolatile memory device 100, an abnormal operation may be generated since the word-line recovery operation is not completed. Thus, although a data output is ended, a command input may be prohibited during a time section tRC between a time point when the status signal RnB is set to a high level and a time point when the word-line recovery operation is completed. Hereinafter, the time section tRC may be referred to as a command wait time. At an access operation of the nonvolatile memory device 100, the memory controller 50 may issue a next command for a read, program, and erase operation after the command wait time tRC elapses.

Figure 24:
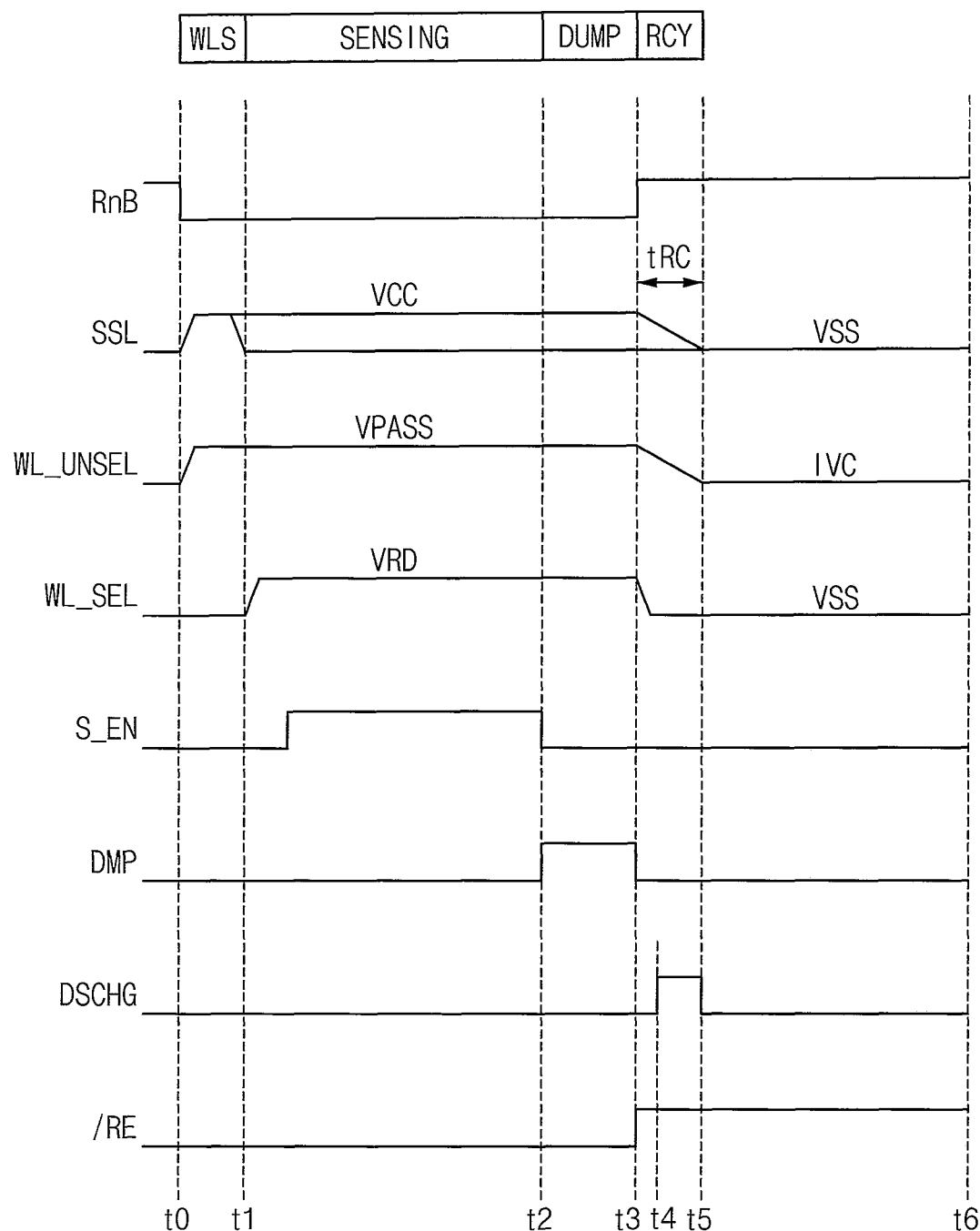
FIG. 24 is a timing diagram schematically illustrating an example of a read operation of the nonvolatile memory device of FIG. 6.

FIG. 24 is a timing diagram schematically illustrating an example of a read operation of the nonvolatile memory device of FIG. 6.

Referring to FIGS. 6 and 24, the nonvolatile memory device 100 may perform a read operation by sequentially performing a word-line setup operation WLS, a sensing operation SENSING, a dump operation DUMP, and a word-line recovery operation RCY in response to a read command (e.g., 00h-ADD-30h).

When the read command is received during a high-level interval of the status (or, a ready/busy) signal RnB, the nonvolatile memory device 100 may set the status signal RnB to a low level and start an overall procedure for sensing selected memory cells.

At a time point t0, the nonvolatile memory device 100 may perform the word-line setup operation. A high level of a voltage (e.g., a power supply voltage VCC) may be applied to a string selection line SSL of a selected memory block in the nonvolatile memory device 100, a read voltage VRD may be applied to a selected word-line WL_SEL, and a read pass voltage VPASS may be applied to unselected word-lines WL_UNSEL.

At a time point t1, the nonvolatile memory device 100 may sense data stored in the selected memory cells. To sense the selected memory cells, the read voltage VRD may be applied to the selected word-line WL_SEL. In an embodiment, a voltage level of the read voltage VRD may be reached at a particular time point between the time point t0 and the time point t1. Although not shown, bit-lines of memory cells may be pre-charged with a specific level for a sensing operation. Under this condition, in response to a sensing enable signal S_EN from the control circuit 450, the page buffer circuit 410 may sense bit-lines or sensing nodes supplied with bit-line precharge voltages. That is, the page buffer circuit 410 may store sensed data at a latch therein according to levels of the sensing nodes.

At a time point t2, the control circuit 450 may provide a dump signal DMP to the page buffer circuit 410. In response to the dump signal DMP, the page buffer circuit 410 may output sensed data of the latch to the data I/O circuit 420. The sensed data output from the page buffer circuit 410 may be stored at a latch unit of the data I/O circuit 420. This dumping operation may be performed until a time point t3.

At the time point t3, the control circuit 450 may control the memory cell array 200, the address decoder 300, the page buffer circuit 410, the voltage generation circuit 500, etc. to discharge all voltages or currents provided for a read operation. That is, a word-line recovery operation may be started at the time point t3 to recover a bias state of the memory cell array 200 to a state before the read operation. In addition, the control circuit 450 may set the status signal RnB to a high level at the time point t3 when the dumping operation is completed. Alternatively, or in addition, if a status read command is received within such an interval, the control circuit 450 may output a ready state. A read enable signal /RE of read data stored in the data I/O circuit 420 may be activated at the point of time t3 when the status signal RnB has a low-to-high transition. For example, the nonvolatile memory device 100 may not output the dumped data through the data I/O terminal I/O while activating the read enable signal /RE.

During a command wait time tRC when the status signal RnB has a high level, the nonvolatile memory device 100 may perform the word-line recovery operation. For example, during the word-line recovery operation, a power supply voltage of the string selection line SSL may be discharged to the ground voltage VSS, and the read voltage applied to the selected word-line WL_SEL may be discharged to the ground voltage VSS. During the word-line recovery operation, a level of the read pass voltage applied to the unselected word-lines WL_UNSEL may be recovered to a level of the internal voltage IVC. The control circuit 450 may internally consume the internal voltage IVC connected to the unselected word-lines WL_UNSEL by activating a particular circuit of the nonvolatile memory device 100. In detail, the particular circuit may be applied with the internal voltage IVC connected to the unselected word-lines WL_UNSEL and may be activated during a discharge period corresponding to time section t4 to t5 during which a discharge signal DSCHG is activated. At the time point t4, the control circuit 450 may provide the activating discharge signal DSCHG to the page buffer circuit 410. Therefore, an overshoot of the internal voltage IVC and be prevented or reduced by operating the particular circuit during the discharge period. Although the discharge signal DSCHG is deactivated at the time point t5 in FIG. 24, the discharge signal DSCHG may be deactivated at a time point earlier than the time point t5. In example embodiments, the particular circuit of the nonvolatile memory device 100 may not be associated with the word-line recovery operation.

The command wait time tRC may be decided in consideration of starting point and ending point of time of the word-line recovery operation. During the command wait time tRC, as described above, a command input may be prohibited after the status signal RnB transitions to a high level.

Discharging the selected word-line WL_SEL and the unselected word-lines WL_UNSEL may be maintained until a time point t6.

Voltage waveforms of the selected word-line WL_SEL and the unselected word-lines WL_UNSEL, the string selection line SSL, and the bit-line BL in the word-line recovery operation (e.g., during a time section t3 to t5) are not limited to the examples shown in FIG. 24.

Figure 25:
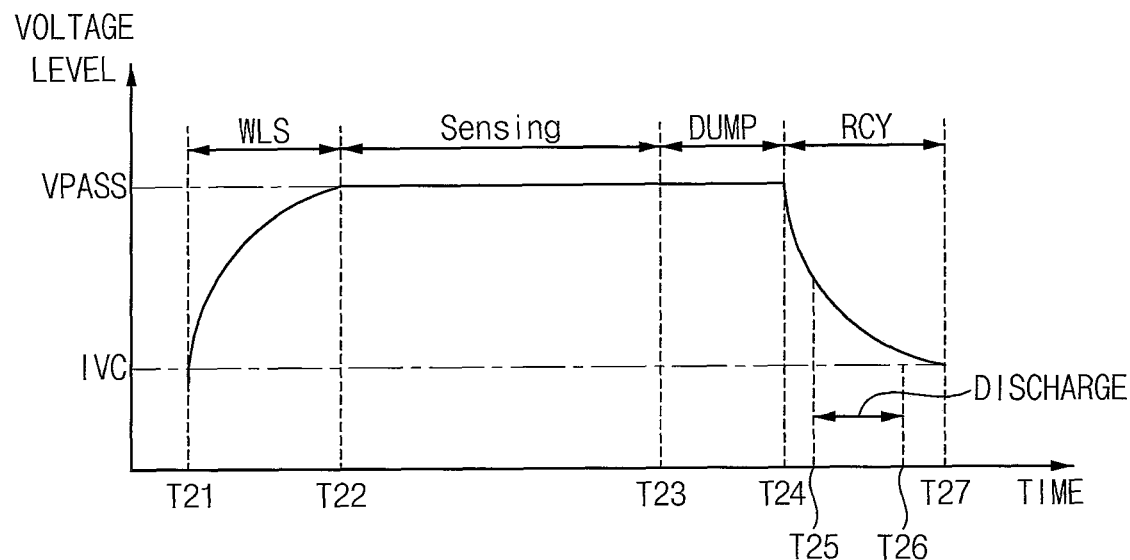
FIG. 25 is a waveform illustrating a voltage level of unselected word-lines during a read operation of the nonvolatile memory device according to example embodiments.

FIG. 25 is a waveform illustrating a voltage level of an unselected word-line during a read operation of the nonvolatile memory device according to example embodiments.

Referring to FIGS. 6, 24 and 25, the nonvolatile memory device 100 may sequentially perform a word-line setup operation WLS, a sensing operation SENSING, a dump operation DUMP, and a word-line recovery operation RCY in response to a read command.

During a word-line setup period corresponding to a time section T21 to T22, the control circuit 450 controls the voltage generation circuit 500 to set up a selected word-line and unselected word-lines to a respective target level. The voltage level of the unselected word-lines is increased from a level of the internal voltage IVC to a level of the read pass voltage VPASS during the word-line setup period. In some examples, the voltage level of the unselected word-lines is increased to the level of the read pass voltage VPASS within the word-line setup period.

During a sensing period corresponding to a time section T22 to T23, the control circuit 450 performs a sensing operation on target memory cells connected to the selected word-line and maintains the voltage level of the unselected word-lines to the level of the read pass voltage VPAS S.

During a dump period corresponding to a time section T23 to T24, the control circuit 450 controls the page buffer circuit 410 to provide the data I/O circuit 420 with the sensed data latched in the page buffer circuit 410.

During a word-line recovery period corresponding to a time section T24 to T27, the control circuit 450 recovers the voltage level of the unselected word-lines to the level of the internal voltage IVC for a next operation. During a discharge period DISCHARGE corresponding to a time section T25 to T26 within the word-line recovery period, the control circuit 450 consumes the internal voltage IVC connected to the unselected word-lines by activating a particular circuit in the nonvolatile memory device 100. Herein, the discharge period DISCHARGE may be predetermined. In example embodiments, the particular circuit applied with the internal voltage IVC which is connected to the unselected word-lines may operate or activate during the discharge period DISCHARGE. For example, the particular circuit may not be associated with the word-line recovery operation in the read operation.

Figure 26:
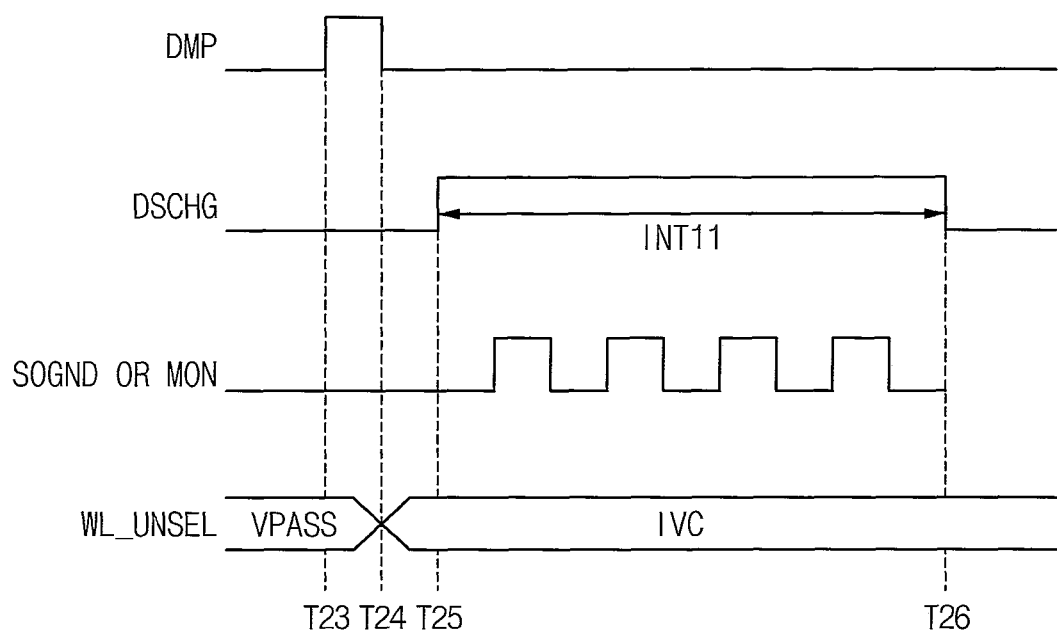
FIG. 26 illustrates an example of a dump operation and a word-line recovery operation in FIG. 25 according to example embodiments.

FIG. 26 illustrates an example of a dump operation and a word-line recovery operation in FIG. 25 according to example embodiments.

Referring to FIGS. 6, 12, 13, 25 and 26, during the dump period corresponding to a time section T23 to T24, the control circuit 450 applies the dump signal DMP to the page buffer circuit 410, and the page buffer circuit 410 may provide the sensed data latched in latches to the data I/O circuit 420 in response to the dump signal DMP. During a discharge period INT11 corresponding to a time section T25 to T26 after a time point T24, the control circuit 450 activates the discharge signal DSCHG. The control circuit 450 may generate toggling ground control signal SOGND and toggling monitoring signals MON_F, MON_M and MON_L based on the activated discharge signal DSCHG, and provide those signals to the page buffer circuit 410.

During the discharge period INT11 in which the discharge signal DSCHG is activated, the control circuit 450 may consume the internal voltage IVC connected to the unselected word-lines by turning on and turning off transistors (for example, transistors in the plurality of inverters INV11, INV12, INV21, INV22, INV31, INV32, INV41 and INV42 in FIG. 12) using the internal voltage IVC, repeatedly, in each of a plurality of page buffers of the page buffer circuit 410. The transistors in the plurality of inverters INV11, INV12, INV21, INV22, INV31, INV32, INV41 and INV42 are connected to the internal voltage IVC and are turned on and off by toggling the ground control signal SOGND and the monitoring signals MON_F, MON_M and MON_L. Accordingly, the internal voltage IVC may be consumed during the discharge period INT11 by activating the transistors of the plurality of inverters INV11, INV12, INV21, INV22, INV31, INV32, INV41 and INV42.

As described with reference to FIGS. 12 and 13, each of PMOS transistors in each of the inverters INV11, INV12, INV21, INV22, INV31, INV32, INV41 and INV42 is connected to the internal voltage IVC. Therefore, when turning on and turning off the transistors in the page buffers connected to a page, repeatedly, during the discharge period INT11, the internal voltage IVC connected to the unselected word-lines is consumed and thus, an overshoot of the internal voltage IVC may be prevented or reduced.

The read pass voltage VPASS is applied to the unselected word-lines WL_UNSEL until the time point T24 and the voltage level of the unselected word-lines WL_UNSEL is recovered to a level of the internal voltage IVC after the time point T24.

The control circuit 450 may determine a number of transistors associated with the discharge operation among transistors in the page buffers connected to the page. In addition, the control circuit 450 may vary a starting time point and an ending time point of the discharge period INT11. In addition, the control circuit 450 may predetermine the discharge period INT11. In some examples, the discharge period INT11 may be determined based on a level of the internal voltage and a reference voltage.

Because the page buffer circuit 410 operates during the bit-line setup period WLS and the sensing period SENSING to sense and latch data from the selected page of the memory cell array 200, the page buffer circuit 410 operating during the discharge period INT11 does not affect an operation of the nonvolatile memory device 100. For example, the page buffer circuit 410 may not be associated with the word-line recovery operation RCY in the read operation.

Figure 27:
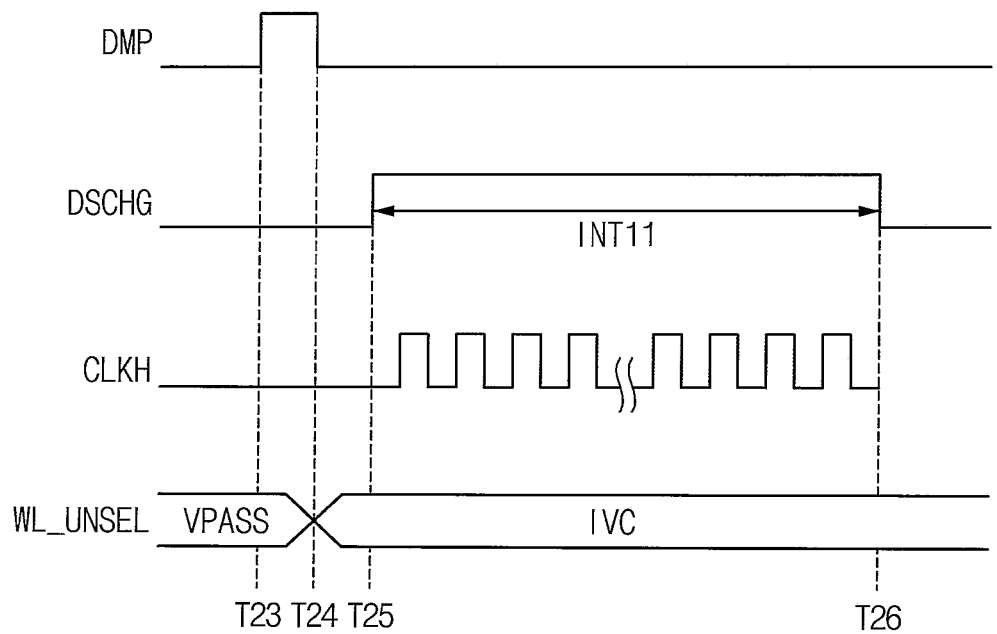
FIG. 27 illustrates an example of a dump operation and a word-line recovery operation in FIG. 25 according to example embodiments.

FIG. 27 illustrates an example of a dump operation and a word-line recovery operation in FIG. 25 according to example embodiments.

Referring to FIGS. 6, 20, 22 and 27, during the dump period corresponding to a time section T23 to T24, the control circuit 450 applies the dump signal DMP to the page buffer circuit 410, and the page buffer circuit 410 may provide the sensed data latched in latches to the data I/O circuit 420 in response to the dump signal DMP. During a discharge period INT11 corresponding to a time section T25 to T26 after the time point T24, the control circuit 450 activates the discharge signal DSCHG.

During the discharge period INT11 in which the discharge signal DSCHG is activated, the control circuit 450 may consume the internal voltage IVC connected to the unselected word-lines by activating the second enable signal EN2 with a low level to operate the oscillator 610. For example, the oscillator 610 may generate toggling clock signal CLKH based on the activating discharge signal DSCHG and second enable signal EN2.

As described with reference to FIG. 22, each source of the PMOS transistors 621, 631 and 641 in the oscillator 610 is connected to the internal voltage IVC. During the discharge period INT11, the clock signal CLKH generated from the oscillator 610 may toggle repeatedly between a high state and a low state. In FIG. 20, the high voltage generator 510 may consume the internal voltage IVC by toggling the clock signal CLKH. Therefore, when the second enable signal EN2 is activated with a low level during the discharge period INT11 in which the discharge signal DSCHG is activated, the internal voltage IVC connected to the unselected word-lines is consumed and thus, an overshoot of the internal voltage IVC may be prevented or reduced.

The read pass voltage VPASS is applied to the unselected word-lines WL_UNSEL until the time point T24 and the voltage level of the unselected word-lines WL_UNSEL is recovered to a level of the internal voltage IVC after the time point T24.

Because the oscillator 610 included in the high voltage generator 510 operates during the bit-line setup period WLS and the sensing period SENSING to generate the read voltage VRD, the internal voltage IVC, the dummy voltage VDUM, the pass voltage VPASS, and the high voltage VPPH, the oscillator 610 operating during the discharge period INT11 does not affect an operation of the nonvolatile memory device 100. For example, the oscillator 610 of the high voltage generator 510 may not be associated with the word-line recovery operation RCY in the read operation.

The control circuit 450 may vary the activation interval of the second enable signal EN2.

Figure 28:
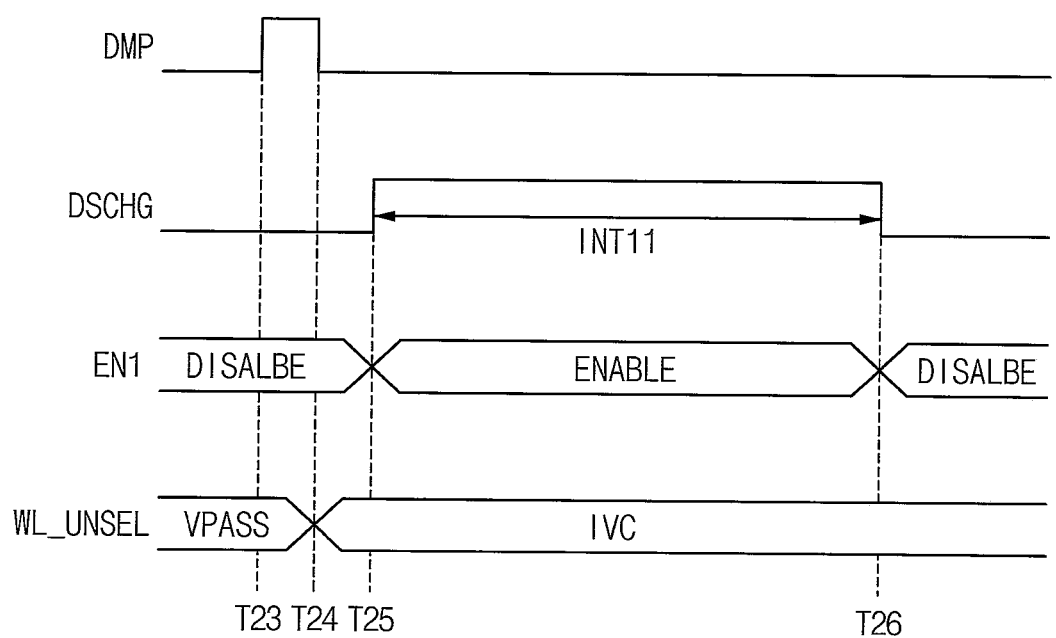
FIG. 28 illustrates an example of a dump operation and a word-line recovery operation in FIG. 25 according to example embodiments.

FIG. 28 illustrates an example of a dump operation and a word-line recovery operation in FIG. 25 according to example embodiments.

Referring to FIGS. 6, 19, 21, 25 and 28, during the dump period corresponding to a time section T23 to T24, the control circuit 450 applies the dump signal DMP to the page buffer circuit 410, and the page buffer circuit 410 may provide the sensed data latched in latches to the data I/O circuit 420 in response to the dump signal DMP. During a discharge period INT11 corresponding to a time section T25 to T26 after the time point T24, the control circuit 450 activates the discharge signal DSCHG.

During the discharge period INT11 in which the discharge signal DSCHG is activated, the control circuit 450 may consume the internal voltage IVC connected to the unselected word-lines by activating the first enable signal EN1 to operate the dummy voltage generator 570.

As described with reference to FIG. 21, the source of the PMOS transistors 572 of the dummy voltage generator 570 is connected to the internal voltage IVC. Therefore, when the first enable signal EN1 is activated during the discharge period INT11 in which the discharge signal DSCHG is activated, the internal voltage IVC connected to the unselected word-lines is consumed and thus, an overshoot of the internal voltage IVC may be prevented or reduced.

The read pass voltage VPASS is applied to the unselected word-lines WL_UNSEL until the time point T24 and the voltage level of the unselected word-lines WL_UNSEL is recovered to a level of the internal voltage IVC after the time point T24.

Because the dummy voltage generator 570 generates the dummy voltage VDUM during the bit-line setup period WLS and the sensing period SENSING, the dummy voltage generator 570 operating during the discharge period INT11 does not affect an operation of the nonvolatile memory device 100. For example, the dummy voltage generator 570 may not be associated with the word-line recovery operation RCY in the read operation.

The control circuit 450 may vary the activation interval of the first enable signal EN1.

Figure 29:
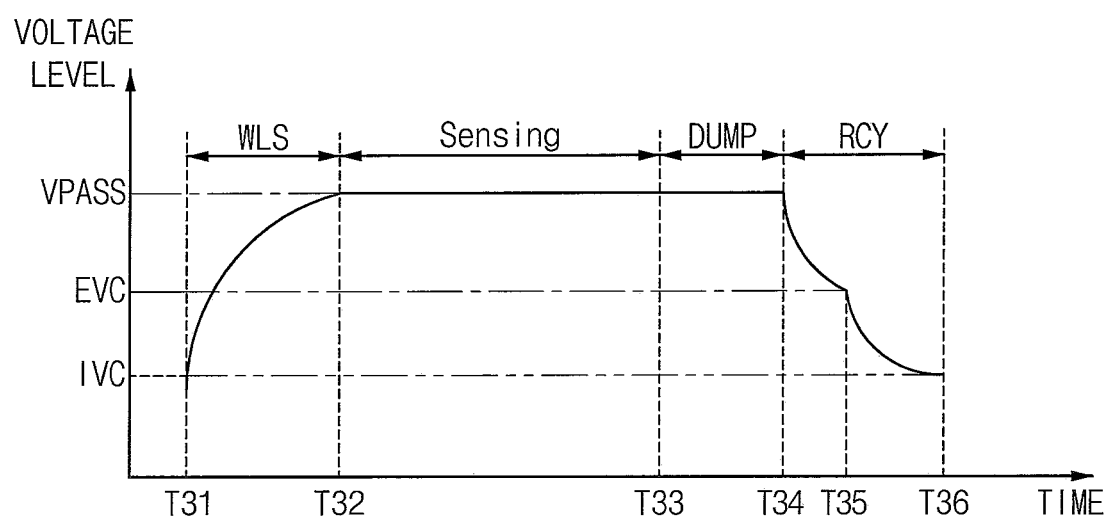
FIG. 29 is a waveform illustrating a voltage level of unselected word-lines during a read operation of the nonvolatile memory device according to example embodiments.

FIG. 29 is a waveform illustrating a voltage level of unselected word-lines during a read operation of the nonvolatile memory device according to example embodiments.

Referring to FIGS. 6 and 29, the nonvolatile memory device 100 may sequentially perform a word-line setup operation WLS, a sensing operation SENSING, a dump operation DUMP, and a word-line recovery operation RCY in response to a read command.

During a word-line setup period corresponding to a time section T31 to T32, the control circuit 450 controls the voltage generation circuit 500 to set up a selected word-line and unselected word-lines to a respective target level. The voltage level of the unselected word-lines is increased from a level of the internal voltage IVC to a level of the read pass voltage VPASS.

During a sensing period corresponding to a time section T32 to T33, the control circuit 450 performs a sensing operation on target memory cells connected to the selected word-line and maintains the voltage level of the unselected word-lines to the level of the read pass voltage VPASS.

During a dump period corresponding to a time section T33 to T34, the control circuit 450 controls the page buffer circuit 410 to provide the data I/O circuit 420 with the sensed data latched in the page buffer circuit 410.

During a word-line recovery period corresponding to a time section T34 to T36, the control circuit 450 recovers the voltage level of the unselected word-lines to a level of the external voltage EVC and to a level of the internal voltage IVC sequentially for a next operation. The level of the external voltage EVC may be greater than the level of the internal voltage IVC.

During a first sub period corresponding to a time section T34 to T35 of the word-line recovery period T34 to T36, the control circuit 450 recovers the voltage level of the unselected word-lines from the level of the read pass voltage VPASS to the level of the external voltage EVC and during a second sub period corresponding to a time section T35 to T36 of the word-line recovery period T34 to T36, the control circuit 450 recovers the voltage level of the unselected word-lines from the level of the external voltage EVC to the level of the internal voltage IVC.

Because voltage level of the unselected word-lines is recovered to the level of the internal voltage IVC after the voltage level of the unselected word-lines is recovered to the level of the external voltage EVC, an overshoot of the internal voltage IVC may be prevented or reduced when the unselected word-lines are connected to the internal voltage IVC.

Therefore, in the nonvolatile memory device and a method of operating the nonvolatile memory device, during the word-line recovery operation in the read operation, a voltage of the unselected word-lines connected to the internal voltage is consumed internally in a particular circuit of the nonvolatile memory device not associated with the word-line recovery operation while recovering the voltage level of the unselected word-lines to a level of the internal voltage, and thus, an overshoot of the internal voltage IVC may be prevented or reduced, which may occur in the word-line recovery operation. For example, the particular circuit using the internal voltage and not associated with the word-line recovery operation may operate during the discharge period in the word-line recovery operation.

Figure 30:
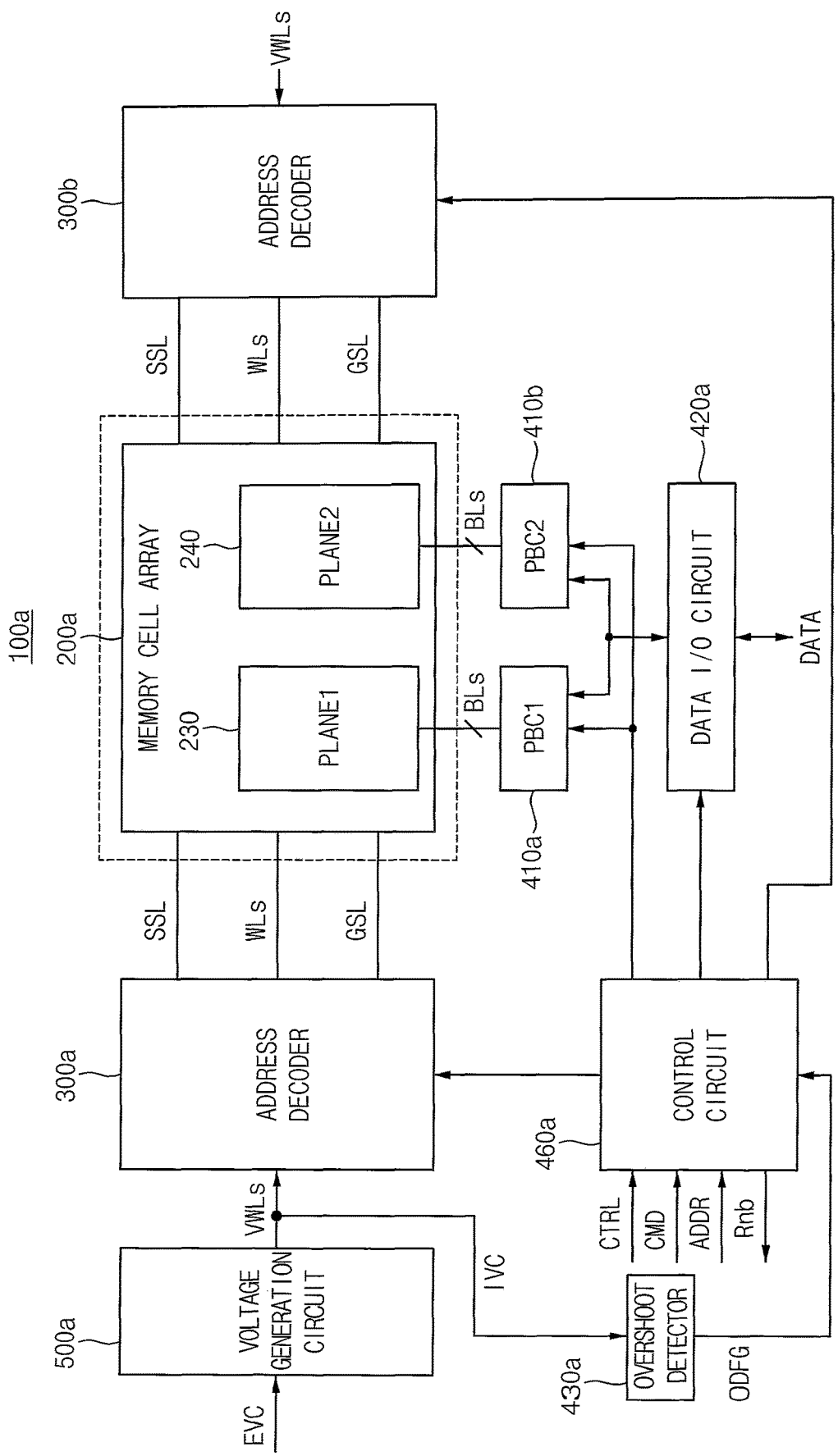
FIG. 30 is a block diagram illustrating a nonvolatile memory device according to example embodiments.

FIG. 30 is a block diagram illustrating a nonvolatile memory device according to example embodiments.

A nonvolatile memory device 100*a* may have multi-plane configuration. Although, the nonvolatile memory device 100*a* of FIG. 30 is illustrated as including two planes such as a first plane 230 and a second plane 240, the nonvolatile memory device 100*a* may include four plane configuration or six plane configuration.

The nonvolatile memory device 100*a* may include a memory cell array 200*a*, a first address decoder 300*a*, a second address decoder 300*b*, a first page buffer circuit 410*a*, a second page buffer circuit 410*b*, a data I/O circuit 420*a*, a control circuit 460*a*, a voltage generation circuit 500*a* and an overshoot detector 430*a*.

The memory cell array 200*a* may include a first plane 230 and a second plane 240, and each of the first plane 230 and the second plane 240 may include a plurality of memory blocks as illustrated in FIG. 8.

Each memory block of each of the first plane 230 and second plane 240 may be coupled to respective one of the first address decoder 300*a* and the second address decoder 300*b* through a string selection line SSL, a plurality of word-lines WLs, and a ground selection line GSL. The memory blocks in the first plane 230 may be coupled to the first page buffer circuit 410a through a plurality of bit-lines BLs and the memory blocks in the second plane 240 may be coupled to the second page buffer circuit 410b through a plurality of bit-lines BLs.

The first page buffer circuit 410a and the second page buffer circuit 410b may be coupled to the data I/O circuit 420a. The control circuit 460a may control the first address decoder 300a, the second address decoder 300b, the first page buffer circuit 410a, the second page buffer circuit 410b, the data I/O circuit 420a and the voltage generation circuit 500a based on the command CMD and the address ADDR from the memory controller 50.

The voltage generation circuit 500a may generate word-line voltages VWLs based on the external voltage EVC and may provide the word-line voltages VWLs to the memory cell array 200a through the first address decoder 300a and the second address decoder 300b.

The overshoot detector 430a may compare an internal voltage IVC connected to unselected word-lines with a reference voltage in recovering word-lines during a read operation of the nonvolatile memory device 100a, and may provide an overshoot detection flag ODFG to the control circuit 460a in response to an overshoot detecting based on a result of the comparison.

The control circuit 460a may control the word-line recovery operation by consuming the internal voltage IVC, connected to the unselected word-lines, internally in the nonvolatile memory device 100a while recovering a voltage level of the unselected word-lines to a level of the internal voltage IVC during a read operation on the target memory cells.

Each of the first address decoder 300a and the second address decoder 300b may employ the address decoder 300 of FIG. 18.

Therefore, each of the first address decoder 300a and the second address decoder 300b in the nonvolatile memory device 100a may provide voltages covering wide ranges corresponding to changes of word-line loading based on plane independent read (PIR) scheme and plane independent core (PIC) scheme.

Figure 31:
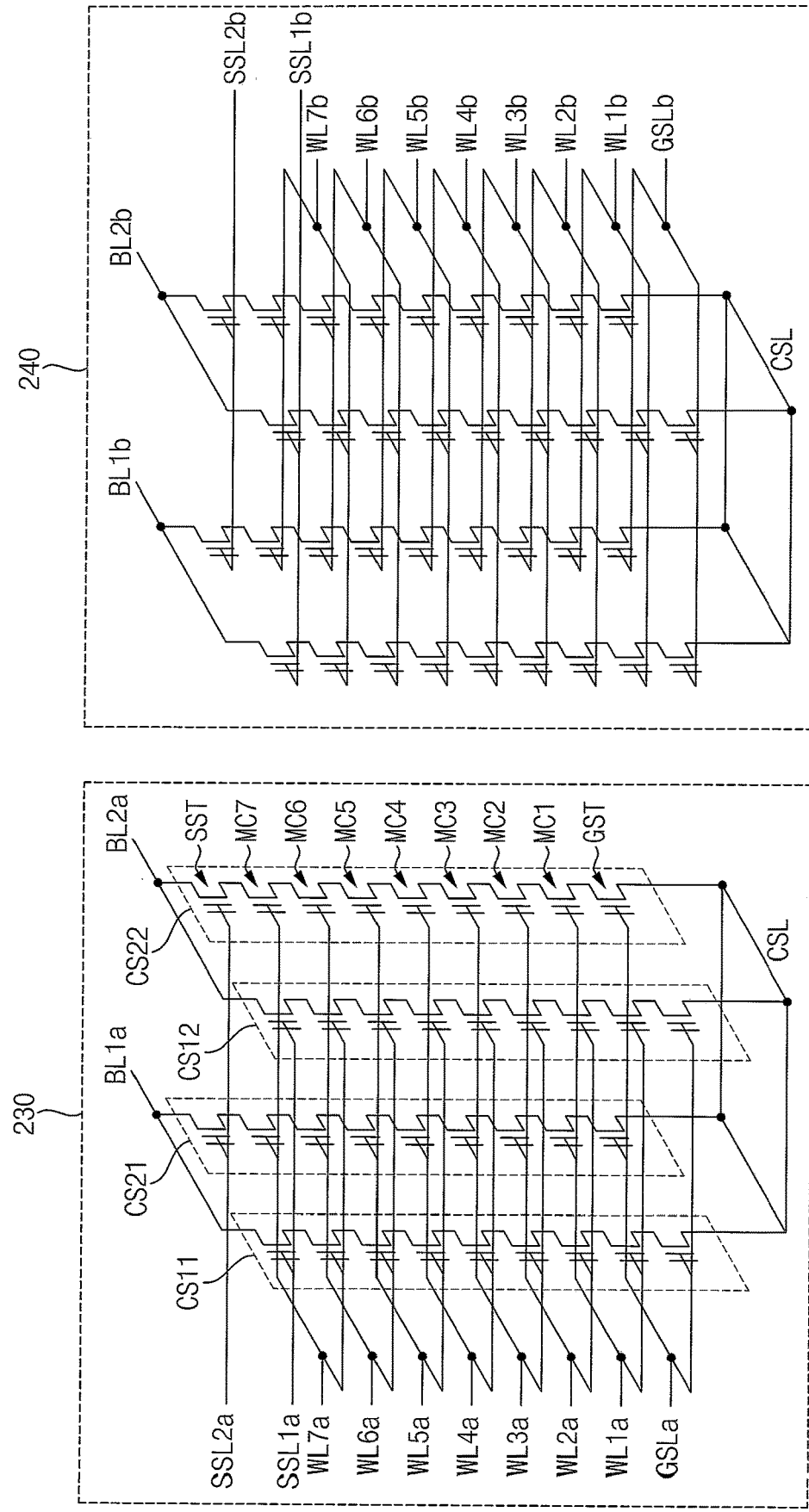
FIG. 31 illustrates a first plane and a second plane of the nonvolatile memory device of FIG. 30 according to example embodiments.

FIG. 31 illustrates a first plane and a second plane of the nonvolatile memory device of FIG. 30 according to example embodiments.

Referring to FIGS. 30 and 31, the memory cell array 200a may include the first plane 230 and a second plane 240. A plurality of memory blocks may be included in the first and second planes 230 and 240. A plurality of cell strings are included in each of the memory blocks. For example, a plurality of cell strings CS11, CS12, CS21, and CS22 are included in one of the memory blocks included in the first plane 230. Each of the planes 230 and 240 may include a plurality of memory blocks, and one of the memory blocks may include a plurality of string selection lines SSL1a and SSL2a to select at least one of the cell strings CS11, CS12, CS21, and CS22. For example, when a selection voltage is applied to the first string selection line SSL1a of the first plane 230, the first and second cell strings CS11 and CS12 may be selected. Similarly, when a selection voltage is applied to the second string selection line SSL2a of the first plane 230, the third and fourth cell strings CS21 and CS22 may be selected.

In example embodiments, the first and second planes 230 and 240 may have substantially the same physical structure. For example, similar to the first plane 230, the second plane 240 may include a plurality of memory blocks and a plurality of cell strings disposed on a single plane. Similarly, the second plane 240 may include a plurality of string selection lines SSL1b and SSL2b configured to select at least one of multiple cell strings.

The first and second planes 230 and 240 do not share a word-line, a bit-line, a string selection line, a ground select line, and a common source line. An example has been described where each plane is connected to two bit-lines and seven word-lines. However, each plane may be connected to three or more bit-lines and seven or more or less word-lines. For example, the first plane 230 is connected to bit-lines BL1a and BL2a, word-lines WL1a-WL7a, and ground selection line GSLa, whereas the second plane 240 is connected to bit-lines BL1b and BL2b, word-lines WL1b-WL7b, and ground selection line GSLb.

Each of the cell strings CS11, CS12, CS21, and CS22 includes at least one string selection transistor, memory cells, and at least one ground selection transistor. For example, a single ground selection transistor GST, a plurality of memory cells MC1 to MC7, and a single string selection transistor SST are sequentially formed at the single cell string CS22 to be perpendicular to a substrate. The other cell strings also have the same structure as the cell string CS22.

In example embodiments, a string selection line connected to each of the planes 230 and 240 is exclusively connected to only one corresponding plane. For example, each of the string selection lines SSL1a and SSL2a is connected to only the first plane 230. Similarly, each of the string selection lines SSL1b and SSL2b is connected to only the second plane 240. Thus, a single string selection line may select only cell strings include in a single plane. In addition, each string selection line may be independently controlled to independently select cell strings in each plane.

For example, a selection voltage may be independently applied to the first string selection line SSL1a to independently select the cell strings CS11 and CS12. When the selection voltage is applied to the first string selection line SSL1a, the selection voltage turns on a string selection transistor of the corresponding cell strings CS11 and CS12. When the string selection transistor is turned on, memory cells of the cell strings CS11 and CS12 and a bit-line are electrically connected to each other.

Meanwhile, when an unselect voltage is applied to the first string selection line SSL1a, the string selection transistor of the cell strings CS11 and CS12 may be turned off and the cell strings CS11 and CS12 may be unselected. Thus, the memory cells of the cell strings CS11 and CS12 are electrically isolated from a bit-line.

According to the above-described configuration, string selection lines separated in each plane are provided. The separated string selection line structure may minimize an effect caused by a defect that occurs at some of the string selection lines. The string selection lines separated in each plane are advantageous in independently selecting a cell string in each plane. That is, cell strings included in the first plane 230 may be selected fully independently of cell strings included in the second plane 240. The independent selection structure allows the nonvolatile memory device 100a to be easily controlled.

Figure 32:
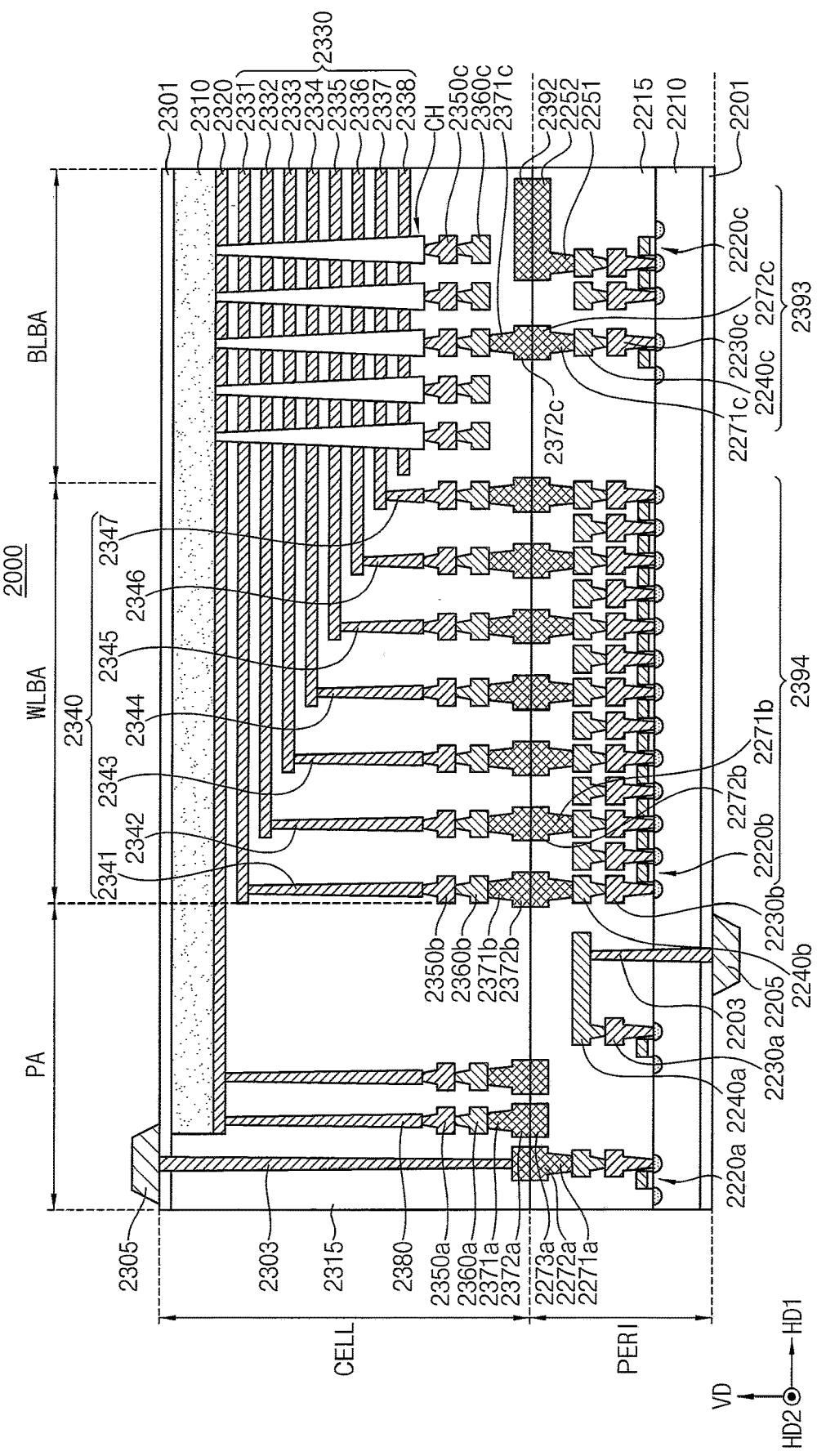
FIG. 32 is a cross-sectional view of a memory device according to example embodiments.

FIG. 32 is a cross-sectional view of a memory device according to example embodiments.

Referring to FIG. 32, a memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. Each of the circuit elements 2220a, 2220b, and 2220c may include one or more transistors. In an example embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an example embodiment illustrate in FIG. 32, although only the first metal layers 2230a, 2230b, and 2230c and the second metal layers 2240a, 2240b, and 2240c are shown and described, the example embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word-line bonding area WLBA. In the word-line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310, an interlayer insulating layer 2315, and a common source line 2320. On the second substrate 2310, a plurality of word-lines 2331, 2332, 2333, 2334, 2335, 2336, 2337, and 2338 (i.e., 2330) may be stacked in a third direction D3 (e.g., a Z-axis direction), perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the third direction D3 (e.g., the Z-axis direction), perpendicular to the upper surface of the second substrate 2310, and pass through the plurality of word-lines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit-line contact, and the second metal layer 2360c may be a bit-line. In an example embodiment, the bit-line 2360c may extend in a second horizontal direction HD2, parallel to the upper surface of the second substrate 2310.

The interlayer insulating layer 2315 may be disposed on the second substrate 2310 to cover the common source line 2320, the plurality of word-lines 2330, a plurality of cell contact plugs 2340, first metal layers 2350a, 2350b, and 2350c, and second metal layers 2360a, 2360b, and 2360c. The interlayer insulating layer 2315 may include an insulating material such as silicon oxide, silicon nitride, or the like.

In an example embodiment illustrated in FIG. 32, an area in which the channel structure CH, the bit-line 2360c, and the like are disposed may be defined as the bit-line bonding area BLBA. In the bit-line bonding area BLBA, the bit-line 2360c may be electrically connected to the circuit elements 2220c providing a page buffer 2393 in the peripheral circuit region PERI. The bit-line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word-line bonding area WLBA, the plurality of word-lines 2330 may extend in a first horizontal direction HD1 (e.g., an X-axis direction), parallel to the upper surface of the second substrate 2310 and perpendicular to the second horizontal direction HD2, and may be connected to a plurality of cell contact plugs 2341, 2342, 2343, 2344, 2345, 2346, and 2347 (i.e., 2340). The plurality of word-lines 2330 and the plurality of cell contact plugs 2340 may be connected to each other in pads provided by at least a portion of the plurality of word-lines 2330 extending in different lengths in the first horizontal direction HD1. A first metal layer 2350b and a second metal layer 2360b may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word-line bonding area WLBA.

The plurality of cell contact plugs 2340 may be electrically connected to the circuit elements 2220b forming a row decoder 2394 in the peripheral circuit region PERI. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220a, 2220b, and 2220c disposed in the peripheral circuit region PERI through a second input/output contact plug 2303. In the example embodiment, the second input/output pad 2305 is electrically connected to a circuit element 2220a.

According to embodiments, the second substrate 2310 and the common source line 2320 may not be disposed in an area in which the second input/output contact plug 2303 is disposed. Also, the second input/output pad 2305 may not overlap the word-lines 2330 in the vertical direction VD. The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 200 may include both the first input/output pad 2205 and the second input/output pad 2305.

A metal pattern provided on an uppermost metal layer may be provided as a dummy pattern or the uppermost metal layer may be absent, in each of the external pad bonding area PA and the bit-line bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the word-line bonding area WLBA. In the word-line bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bit-line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In example embodiments, the memory device 2000 may correspond to the nonvolatile memory device 100 or 100a previously described. The memory cell array 200 or 200a previously described may be included in the cell region CELL. The peripheral circuit 200 previously described may be included in the peripheral circuit region PERI.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The above-mentioned word-line voltages and high voltage may be applied to at least one memory block in the cell region CELL through the lower bonding metals 2271b and 2272b in the peripheral circuit region PERI and upper bonding metals 2371b and 2372b in the cell region CELL. The control circuit may recover a voltage level of unselected word-lines to a level of an internal voltage while consuming the internal voltage internally in the memory device 2000.

Figure 33:
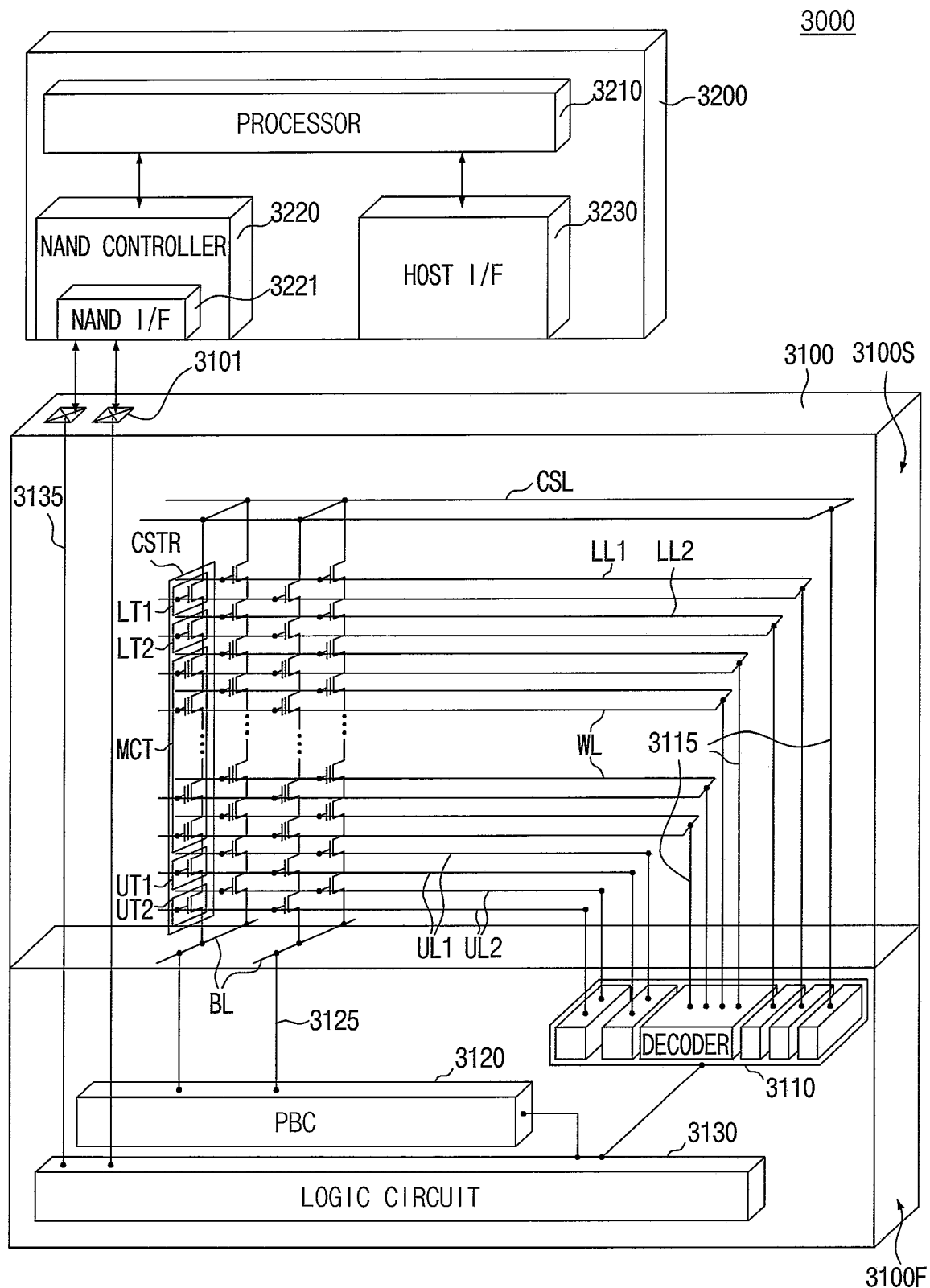
FIG. 33 is a block diagram illustrating an electronic system including a semiconductor device according to example embodiments.

FIG. 33 is a block diagram illustrating an electronic system including a semiconductor device according to example embodiments.

Referring to FIG. 33, an electronic system 3000 may include a semiconductor device 3100 and a controller 3200 electrically connected to the semiconductor device 3100. The electronic system 3000 may be a storage device including one or more semiconductor devices 3100 or an electronic device including a storage device. For example, the electronic system 3000 may be a solid state drive (SSD) device, a universal serial bus (USB), a computing system, a medical device, or a communication device that may include one or more semiconductor devices 3100.

The semiconductor device 3100 may be a memory device, for example, the nonvolatile memory device 100 or 100a that will be illustrated with reference to FIGS. 6 to 14, 16 to 22, and 30. The semiconductor device 3100 may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may be a memory cell array structure including a bit-line BL, a common source line CSL, word-lines WLs, first and second upper gate lines UL1 and UL2, first and second lower gate lines LL1 and LL2, and memory cell strings CSTR between the bit-line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In example embodiments, the upper transistors UT1 and UT2 may be string selection transistors, and the lower transistors LT1 and LT2 may be ground selection transistors. The lower gate lines LL1 and LL2 may be gate electrodes of the lower transistors LT1 and LT2, respectively. The word-lines WLs may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may be a lower erase control transistor LT1 and a ground selection transistor LT2 that may be connected to each other in serial. The upper transistors UT1 and UT2 may be a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word-lines WLs, and the first and second upper gate lines UL1 and UL2 may be electrically connected to the decoder circuit 3110 through first connection wirings 3115 extending to the second structure 3110S from the first structure 3100F. The bit-lines BLs may be electrically connected to the page buffer circuit 3120 through second connection wirings 3125 extending to the second structure 3100S from the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S from the first structure 3100F.

The controller 3200 may include a processor 3210, a NAND controller 3220, and a host interface 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When control command is received from the outside host through the host interface 3230, the processor 3210 may control the semiconductor device 3100 in response to the control command.

A nonvolatile memory device or a storage device according to example embodiments may be packaged using various package types or package configurations.

The inventive concept may be applied to various devices and systems that include the nonvolatile memory devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the appending claims.

What is claimed is:

1. A method of operating a nonvolatile memory device that includes at least one memory block including a plurality of cell strings where each of the plurality of cell strings includes a string selection transistor, a plurality of memory cells and a ground selection transistor which are connected in series and disposed in a vertical direction between a bit-line and a common source line, the method comprising:

during a word-line setup period, setting up each of a plurality of word-lines coupled to the plurality of memory cells to a respective target level;

during a sensing period, performing a sensing operation on target memory cells of the plurality of memory cells by applying a read voltage to a selected word-line coupled to the target memory cells, among the plurality of word-lines while applying a read pass voltage to unselected word-lines among the plurality of word-lines;

during a word-line recovery period, performing a word-line recovery operation by recovering a voltage level of the read pass voltage applied to the unselected word-lines to a level of an internal voltage; and during a discharge period within the word-line recovery period, consuming the internal voltage connected to the unselected word-lines by activating a particular circuit of the nonvolatile memory device, wherein the particular circuit is supplied with the internal voltage and is not associated with the word-line recovery operation.

2. The method of claim 1, wherein the consuming of the internal voltage includes:

during the discharge period, turning on and turning off transistors of the particular circuit, repeatedly, wherein the performing of the sensing operation includes sensing and latching data of the target memory cells by a selected page buffer among a plurality of page buffers of a page buffer circuit in the nonvolatile memory device, and wherein the particular circuit includes the plurality of page buffers coupled to the at least one memory block through a plurality of bit-lines.

3. The method of claim 1, wherein the consuming of the internal voltage includes:
during the discharge period, generating a toggling clock signal based on the internal voltage from the particular circuit,
wherein the performing of the sensing operation includes generating word-line voltages including the read voltage and the read pass voltage from a voltage generation circuit in the nonvolatile memory device, and
wherein the particular circuit includes an oscillator of the voltage generation circuit configured to generate the toggling clock signal.

4. The method of claim 1, wherein the consuming of the internal voltage includes:
during the discharge period, generating a dummy voltage based on the internal voltage from the particular circuit,
wherein the performing of the sensing operation includes generating word-line voltages including the read voltage, the read pass voltage, and the dummy voltage from a voltage generation circuit in the nonvolatile memory device, and
wherein the particular circuit includes a dummy voltage generator of the voltage generation circuit and is configured to generate the dummy voltage.

5. The method of claim 1, wherein the discharge period is determined based on comparing a level of the internal voltage and a reference voltage.

6. The method of claim 1, wherein the discharge period is pre-determined by a control circuit configured to control an operation of the nonvolatile memory device.

7. The method of claim 1, wherein a starting time point and an ending time point of the discharge period are variable.

8. A nonvolatile memory device comprising:
a memory cell array that includes at least one memory block including a plurality of cell strings where each of the plurality of cell strings includes a string selection transistor, a plurality of memory cells and a ground selection transistor which are connected in series and disposed in a vertical direction between a bit-line and a common source line; and
a control circuit configured to:
during a word-line set-up period, set up each of a plurality of word-lines coupled to the plurality of memory cells to a respective target level;
during a sensing period, perform a sensing operation on target memory cells of the plurality of memory cells by applying a read voltage to a selected word-line coupled to the target memory cells, among the plurality of word-lines while applying a read pass voltage to unselected word-lines among the plurality of word-lines;
during a word-line recovery period, perform a word-line recovery operation by recovering a voltage level of the unselected word-lines to a level of an internal voltage; and
during a discharge period within the word-line recovery period, consume the internal voltage connected to the unselected word-lines to which the read pass voltage is applied, in a particular circuit of the nonvolatile memory device,
wherein the particular circuit supplied with the internal voltage is configured to be activated during the discharge period, and the particular circuit is not associated with the word-line recovery operation.

9. The nonvolatile memory device of claim 8, further comprising:
a voltage generation circuit configured to generate word-line voltages including the read voltage and the read pass voltage based on control signals from the control circuit;
an address decoder configured to provide the word-line voltages to the at least one memory block based on a row address; and
a page buffer circuit coupled to the at least one memory block through a plurality of bit-lines, the page buffer circuit configured to latch sensed data in the sensing operation.

10. The nonvolatile memory device of claim 9, wherein the particular circuit includes a plurality of page buffers of the page buffer circuit, and
wherein the control circuit is configured to consume the internal voltage by turning on and turning off transistors using the internal voltage, repeatedly, in each of the plurality of page buffers during the discharge period.

11. The nonvolatile memory device of claim 10, wherein the transistors of the page buffer circuit are configured to activate transistors d-that connect each sensing node of each of the plurality of page buffers to latches of each of the plurality of page buffers.

12. The nonvolatile memory device of claim 9, wherein the particular circuit includes an oscillator of the voltage generation circuit, and
wherein the control circuit is configured to control the voltage generation circuit to generate a toggling clock signal based on the internal voltage from the oscillator during the discharge period.

13. The nonvolatile memory device of claim 12, wherein the control circuit is configured to consuming the internal voltage by enabling the oscillator during the discharge period.

14. The nonvolatile memory device of claim 9, wherein:
the particular circuit includes a dummy voltage generator of the voltage generation circuit,
the control circuit is configured to, during the discharge period, control the dummy voltage generator to generate a dummy voltage based on the internal voltage, and
the control circuit is configured to consume the internal voltage by enabling the dummy voltage generator during the discharge period.

15. The nonvolatile memory device of claim 9, further comprising:
an overshoot detector configured to compare the internal voltage with a reference voltage to generate an overshoot detection flag based on a result of the comparison,
wherein the control circuit is configured to set the discharge period based on the overshoot detection flag.

16. The nonvolatile memory device of claim 9, further comprising:
a data input/output circuit connected to the page buffer circuit,
wherein the control circuit is further configured to, during a dump period, dump the sensed data latched in the page buffer circuit to the data input/output circuit, and
wherein the control circuit is configured to set a status signal from a busy state to a ready state after the data input/output circuit stores the sensed data and before the word-line recovery period ends.

17. The nonvolatile memory device of claim 16, wherein the control circuit is configured to receive a command from an external device after a reference time interval elapses from a timing point at which the status signal is transitioned to the ready state.

18. The nonvolatile memory device of claim 9, wherein:
the memory cell array is disposed in a first semiconductor layer,
the control circuit, the voltage generation circuit, the address decoder and the page buffer circuit are disposed in a second semiconductor layer, and
the first semiconductor layer and the second semiconductor layer are vertically stacked.

19. A nonvolatile memory device comprising:
a memory cell array that includes at least one memory block including a plurality of cell strings where each of the plurality of cell strings includes a string selection transistor, a plurality of memory cells and a ground selection transistor which are connected in series and disposed in a vertical direction between a bit-line and a common source line; and
a control circuit configured to:
during a word-line set-up period, set up each of a plurality of word-lines coupled to the plurality of memory cells to a respective target level;
during a sensing period, perform a sensing operation on target memory cells of the plurality of memory cells by applying a read voltage to a selected word-line coupled to the target memory cells, among the plurality of word-lines while applying a read pass voltage to unselected word-lines among the plurality of word-lines; and
during a word-line recovery period, perform a word-line recovery operation by recovering a voltage level of the unselected word-lines to a level of an external voltage applied from an external device of the nonvolatile memory device and to a level of an internal voltage greater than a ground voltage and smaller than the level of the external voltage, sequentially.

20. The nonvolatile memory device of claim 19, further comprising:
a voltage generation circuit configured to generate word-line voltages including the read voltage and the read pass voltage based on control signals from the control circuit;
an address decoder configured to provide the word-line voltages to the at least one memory block based on a row address;
a page buffer circuit coupled to the memory cell array through a plurality of bit-lines, the page buffer circuit configured to latch sensed data during the sensing operation; and
a data input/output circuit connected to the page buffer circuit,
wherein the control circuit is further configured to, during a dump period, dump the sensed data latched in the page buffer circuit to the data input/output circuit, and
wherein the control circuit is configured to set a status signal from a busy state to a ready state after the data input/output circuit stores the sensed data and before the word-line recovery period ends.

* * * * *